US012368162B2

(12) United States Patent
Cao et al.

(10) Patent No.: US 12,368,162 B2
(45) Date of Patent: *Jul. 22, 2025

(54) NANOSTRUCTURED BATTERY ACTIVE MATERIALS AND METHODS OF PRODUCING SAME

(71) Applicant: OneD Material, Inc., Palo Alto, CA (US)

(72) Inventors: Wanqing Cao, Fremont, CA (US); Virginia Robbins, Los Gatos, CA (US); Yimin Zhu, Union City, CA (US)

(73) Assignee: OneD Material, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/607,531

(22) Filed: Mar. 17, 2024

(65) Prior Publication Data
US 2024/0282933 A1 Aug. 22, 2024

Related U.S. Application Data

(63) Continuation of application No. 18/111,549, filed on Feb. 18, 2023, now Pat. No. 11,967,707, which is a
(Continued)

(51) Int. Cl.
H01M 4/38 (2006.01)
B01J 21/18 (2006.01)
(Continued)

(52) U.S. Cl.
CPC ............. *H01M 4/366* (2013.01); *B01J 21/18* (2013.01); *B01J 23/72* (2013.01); *B01J 37/0211* (2013.01);
(Continued)

(58) Field of Classification Search
CPC ........ B01J 37/0211; B01J 21/18; B01J 23/72; H01M 4/366; H01M 4/0428;
(Continued)

(56) References Cited

U.S. PATENT DOCUMENTS 4,136,216 A  1/1979 Feldstein
4,171,225 A  10/1979 Molenaar et al.
(Continued)

FOREIGN PATENT DOCUMENTS

CN  1424149 A  6/2003
CN  1490439 A  4/2004
(Continued)

OTHER PUBLICATIONS

Chinese Board Decision directed to related Chinese Application No. 2012-80041299.4, mailed Nov. 13, 2017.
(Continued)

*Primary Examiner* — Alexander Usyatinsky
(74) *Attorney, Agent, or Firm* — Nixon Peabody LLP; Jennifer Hayes

(57) ABSTRACT

Methods for producing nanostructures from copper-based catalysts on porous substrates, particularly silicon nanowires on carbon-based substrates for use as battery active materials, are provided. Related compositions are also described. In addition, novel methods for production of copper-based catalyst particles are provided. Methods for producing nanostructures from catalyst particles that comprise a gold shell and a core that does not include gold are also provided.

21 Claims, 7 Drawing Sheets

Related U.S. Application Data continuation of application No. 16/355,454, filed on Mar. 15, 2019, now Pat. No. 11,616,225, which is a continuation of application No. 14/234,565, filed as application No. PCT/US2012/047979 on Jul. 24, 2012, now Pat. No. 10,243,207.

(60) Provisional application No. 61/511,826, filed on Jul. 26, 2011.

(51) Int. Cl.

| | | |
|---|---|---|
| *B01J 23/72* | (2006.01) | |
| *B01J 37/02* | (2006.01) | |
| *C01B 33/02* | (2006.01) | |
| *C01B 33/021* | (2006.01) | |
| *C01B 33/029* | (2006.01) | |
| *C30B 11/12* | (2006.01) | |
| *C30B 25/00* | (2006.01) | |
| *C30B 29/06* | (2006.01) | |
| *C30B 29/60* | (2006.01) | |
| *H01M 4/04* | (2006.01) | |
| *H01M 4/134* | (2010.01) | |
| *H01M 4/36* | (2006.01) | |
| *H01M 4/62* | (2006.01) | |

(52) U.S. Cl.
CPC ............ *C01B 33/02* (2013.01); *C01B 33/021* (2013.01); *C01B 33/029* (2013.01); *C30B 11/12* (2013.01); *C30B 25/005* (2013.01); *C30B 29/06* (2013.01); *C30B 29/60* (2013.01); *H01M 4/0428* (2013.01); *H01M 4/0495* (2013.01); *H01M 4/134* (2013.01); *H01M 4/36* (2013.01); *H01M 4/386* (2013.01); *H01M 4/622* (2013.01); *C01P 2004/16* (2013.01); *C01P 2004/64* (2013.01)

(58) Field of Classification Search
CPC ...... H01M 4/0495; H01M 4/134; H01M 4/36; H01M 4/386; H01M 4/622; C01B 33/02; C01B 33/021; C01B 33/029; C30B 11/12; C30B 25/005; C30B 29/06; C30B 29/60; C01P 2004/64; C01P 2004/16

See application file for complete search history.

(56) References Cited

U.S. PATENT DOCUMENTS

| | | | |
|---|---|---|---|
| 4,400,436 A | 8/1983 | Breininger et al. | |
| 5,677,082 A | 10/1997 | Greinke et al. | |
| 5,897,945 A | 4/1999 | Lieber et al. | |
| 5,997,832 A | 12/1999 | Lieber et al. | |
| 6,036,774 A | 3/2000 | Lieber et al. | |
| 6,225,198 B1 | 5/2001 | Alivisatos et al. | |
| 6,303,266 B1 | 10/2001 | Okino et al. | |
| 6,306,736 B1 | 10/2001 | Alivisatos et al. | |
| 6,479,030 B1 | 11/2002 | Firsich | |
| 6,962,823 B2 | 11/2005 | Empedocles et al. | |
| 7,067,867 B2 | 6/2006 | Duan et al. | |
| 7,105,428 B2 | 9/2006 | Pan et al. | |
| 7,211,464 B2 | 5/2007 | Lieber et al. | |
| 7,301,199 B2 | 11/2007 | Lieber et al. | |
| 7,569,941 B2 | 8/2009 | Majumdar et al. | |
| 7,776,760 B2 | 8/2010 | Taylor | |
| 7,825,036 B2 | 11/2010 | Yao et al. | |
| 7,842,432 B2 | 11/2010 | Niu et al. | |
| 7,951,422 B2 | 5/2011 | Pan et al. | |
| 8,623,288 B1 | 1/2014 | Dubrow et al. | |
| 10,243,207 B2 | 3/2019 | Cao et al. | |
| 11,616,225 B2 | 3/2023 | Cao et al. | |
| 11,967,707 B2 | 4/2024 | Cao et al. | |
| 2004/0026684 A1 | 2/2004 | Empedocles | |
| 2006/0188774 A1 | 8/2006 | Niu et al. | |
| 2007/0051927 A1 | 3/2007 | Itoh et al. | |
| 2007/0166899 A1* | 7/2007 | Yao ......................... | C30B 11/12 438/162 |
| 2008/0011125 A1 | 1/2008 | Shirata et al. | |
| 2008/0038520 A1 | 2/2008 | Pan et al. | |
| 2008/0135089 A1 | 6/2008 | Tsakalakos et al. | |
| 2008/0312070 A1 | 12/2008 | Talbot et al. | |
| 2009/0143227 A1* | 6/2009 | Dubrow ................. | D06M 11/46 502/406 |
| 2010/0273316 A1* | 10/2010 | Renard ................... | C01B 33/03 257/E21.09 |
| 2010/0297502 A1* | 11/2010 | Zhu ........................ | H01M 4/134 977/948 |
| 2010/0323884 A1* | 12/2010 | Roldan Cuenya ....... | B01J 23/42 977/773 |
| 2011/0008707 A1 | 1/2011 | Muraoka et al. | |
| 2011/0039690 A1 | 2/2011 | Niu | |
| 2011/0067228 A1 | 3/2011 | Green | |
| 2011/0111300 A1* | 5/2011 | DelHagen ............. | H01M 4/134 427/78 |
| 2011/0200873 A1 | 8/2011 | Hu et al. | |
| 2011/0309306 A1* | 12/2011 | Zhou ...................... | C30B 29/16 117/88 |
| 2012/0003397 A1 | 1/2012 | Reniers et al. | |
| 2015/0086871 A1 | 3/2015 | Cao et al. | |
| 2019/0214641 A1 | 7/2019 | Cao et al. | |
| 2023/0411602 A1 | 12/2023 | Cao et al. | |
| 2024/0290958 A1 | 8/2024 | Cao et al. | |

FOREIGN PATENT DOCUMENTS

| | | |
|---|---|---|
| CN | 101000867 A | 7/2007 |
| CN | 101790805 A | 7/2010 |
| CN | 101791538 A | 8/2010 |
| CN | 102460782 A | 5/2012 |
| CN | 102530931 A | 7/2012 |
| CN | 103035915 A | 4/2013 |
| CN | 103764544 A | 4/2014 |
| CN | 108452790 A | 8/2018 |
| CN | ZL201810147669.1 | 5/2022 |
| EP | 2378597 A1 | 10/2011 |
| EP | 2736837 A2 | 6/2014 |
| EP | 2736837 B1 | 9/2021 |
| EP | 3978426 A1 | 4/2022 |
| EP | 4360756 A2 | 5/2024 |
| EP | 4364849 A2 | 5/2024 |
| EP | 4364849 A3 | 10/2024 |
| JP | 2007186416 A | 7/2007 |
| JP | 2008523565 A | 7/2008 |
| JP | 2010-260170 A | 11/2010 |
| JP | 2014-532023 A | 12/2014 |
| JP | 6142362 | 5/2017 |
| JP | 2017-137239 A | 8/2017 |
| JP | 6345834 | 6/2018 |
| KR | 100778011 B1 | 11/2007 |
| KR | 20080044181 A | 5/2008 |
| KR | 101073853 B1 | 10/2011 |
| KR | 10-2014-0068033 A | 6/2014 |
| KR | 10-1895386 | 8/2018 |
| KR | 10-2051770 | 11/2019 |
| WO | WO-2006062947 A2 | 6/2006 |
| WO | WO-2006138671 A2 | 12/2006 |
| WO | WO-2007061945 A2 | 5/2007 |
| WO | WO-2010129910 A2 | 11/2010 |
| WO | WO-2011060024 A2 | 5/2011 |
| WO | WO-2013016339 A2 | 1/2013 |

OTHER PUBLICATIONS

Chinese Certificate of Patent in Application No. 2018-10147669.1 (Patent No. ZL201810147669.1) dated May 3, 2022.
Chinese Notice of Reexamination in Chinese Application No. 2012-80041299.4, dated Mar. 29, 2017.
Chinese Office Action (with English language translation) directed to related Chinese Application No. 2012-80041299.4, mailed Feb. 27, 2015.

(56) References Cited

OTHER PUBLICATIONS

Chinese Office Action in Chinese Application No. 2012-80041299.4, dated Aug. 1, 2016.
Chinese Office Action in Chinese Application No. 2012-80041299.4, dated Nov. 27, 2015.
Chinese Office Action in Chinese Application No. 2018-10147669.1, dated Feb. 24, 2021.
Chinese Search Report in Chinese Application No. 2018-10147669.1, mailed Feb. 19, 2021.
Chinese Third Office Action in Chinese Application No. 2018-10147669.1, mailed Sep. 10, 2021.
EP Communication pursuant to Article 94(3) in EP application No. 12817748.2 dated Feb. 4, 2021.
EP Communication pursuant to Article 94(3) in EP application No. 12817748.2 dated May 18, 2020.
EP Communication pursuant to Article 94(3) in EP application No. 12817748.2 dated May 22, 2019.
Extended European Search Report in EP application No. 21199255.7 dated Feb. 10, 2022.
International Preliminary Report on Patentability in PCT Application No. PCT/US2012/047979, dated Jan. 28, 2014.
International Search Report directed to related international application No. PCT/US2012/047979, mailed Feb. 28, 2013.
Chinese Office Action in Chinese Application No. 2018-10147669.1, dated May 28, 2020.
Japanese Notice of Allowance in Japanese Application No. 2014-522942, dated Mar. 14, 2017.
Japanese Notice of Allowance in Japanese Application No. 2017-078418, dated May 15, 2018.
Japanese Office Action in Japanese Application No. 2014-522942, dated Aug. 9, 2016.
Korean Decision to Grant in Korean Application No. 10-2014-7004916, dated May 29, 2018.
Korean Office Action in Korean Application No. 10-2014-7004916, dated Nov. 1, 2017.
Korean Office Action in Korean Application No. 10-2018-7025051, dated Nov. 20, 2018.
Notice of Allowance in U.S. Appl. No. 14/234,565, mailed Dec. 10, 2018.
Notice of Allowance in U.S. Appl. No. 14/234,565, mailed Nov. 15, 2018.
Notice of Allowance in U.S. Appl. No. 16/355,454, mailed Feb. 1, 2023.
Office Action in U.S. Appl. No. 14/234,565, mailed Jan. 17, 2018.
Office Action in U.S. Appl. No. 16/355,454, mailed Mar. 30, 2022.
Office Action in U.S. Appl. No. 18/111,549, mailed Nov. 28, 2023 (12 pp.).
Written Opinion of the International Search Authority directed to related international application No. PCT/US2012/047979, mailed Feb. 28, 2013.
Arbiol et al., "Influence of Cu as a catalyst on the properties of silicon nanowires synthesized by the vapour-solid-solid mechanism", Nanotechnology 18 (2007) pp. 1-8, IOP Publishing Ltd., Printed in the UK.
Bindra et al. "Fundamental Aspects of Electroless Copper Plating", Electroless Plating Fundamentals and Applications (1990) pp. 289-329, American Electroplaters and Surface Finishers Society.
Bjork et al., "One-dimensional Steeplechase for Electrons Realized", Nano Letters, 2002, vol. 2, No. 2, pp. 87-89, American Chemical Society.
Cao, Y. et al. "Growth and properties of semiconductor core/shell nanocrystals with InAs cores", J. Am. Chem. Soc. (2000) 122, pp. 9692-9702.
Capaccio "Wastewater Treatment for Electroless Plating", (1990) pp. 519-528, American Electroplaters and Surface Finishers Society.
Chan et al. "Solution-Grown Silicon Nanowires for Lithium-Ion Battery Anodes", ACS Nano (2010) 4(3):1443-1450, American Chemical Society.

Chan, C. K., et al., "High-performance lithium battery anodes using silicon nanowires", nature nanotechnology, vol. 3, Jan. 2008, pp. 31-35; 2008 Nature Publishing Group, Published online: Dec. 16, 2007.
Chen et al. "Hybrid Silicon-Carbon Nanostructured Composites as Superior Anodes for Lithium Ion Batteries", Nano Research (2011) 4(3):290-296, Tsinghua University Press.
Chen, H. et al. "Electroless Plating Copper on Carbon Nanotubes by One-Step Activation", Nanosci & Nanotech (2009) 6(4):42-50 (w/English language Abstract).
Chen, H. et al. "Silicon Nanowires With and Without Carbon Coating as Anode Materials for Lithium-Ion Batteries," J Solid State Electrochem (Jan. 28, 2010) 14:1829-1834.
Cui, Le-Feng, et al. "Carbon-silicon core-shell nanowires as high capacity electrode for lithium ion batteries", Nano Lett (2009) 9(9):3370-3374.
Cui, Li-Feng, et al. "Crystalline-Amorphous Core-Shell Silicon Nanowires for high Capacity and High Current Battery Electrodes", Nano Lett (2009) 9(1):491-495.
Cui, Y. et al. "Diameter-controlled synthesis of single-crystal silicon nanowires", Appl. Phys. Lett (2001) 78(15):2214-2216.
Cui, Y. et al. "Doping and electrical transport in silicon nanowires", J. Phys. Chem. B (2000) 104:5213-5216.
Dabbousi, B.O. et al., "(CdSe)ZnS core-shell quantum dots: Synthesis and characterization of a size series of highly luminescent nanocrystallites", J. Phys. Chem. B (1997) 101:9463-9475.
Duan, X. et al. "General synthesis of compound semiconductor nanowires", Adv. Mater. (2000) 12:298-302.
Gudiksen, M.S. et al., "Diameter-selective synthesis of semiconductor nanowires", J. Am. Chem. Soc. (2000) 122:8801-8802.
Gudiksen, M.S. et al., "Growth of nanowire superlattice structures of nanoscale photonics and electronics", Nature (2002) 415-617-620.
Gudiksen, M.S. et al., "Synthetic control of the diameter and length of single crystal semiconductor nanowires", J. Phys. Chem. B (2001) 105: pp. 4062-4064.
Holzapfel, M., et al., "A new type of nano-sized silicon/carbon composite electrode for reversible lithium insertion", Chem. Commun., Jan. 26, 2005; pp. 1566-1568; The Royal Society of Chemistry 2005.
Huang, R. et al. "Carbon-coated Silicon Nanowire Array Films for High-Performance Lithium-Ion Battery Anodes", Appl Phys Lett (Oct. 1, 2009) 95, pp. 33119-1 to 133119-3.
Hung et al. "Room-temperature formation of hallow Cu2O nanoparticles", Adv. Mat (2010) 22:1910-1914.
Kolasinski, K. W., "Catalytic growth of nanowires: Vapor-liquid-solid, vapor-solid-solid, solution-liquid-solid and solid-liquid-solid-growth", Current Opinion in Solid State and Materials Science, vol. 10, Issues 3-4, Jun.-Aug. 2006, pp. 182-191; Elsevier.
Kooti et al. "Fabrication of Nanosized Cuprous Oxide Using Fehling's Solution", Scientia Iranica Transaction F: Nanotech (2010) 17(1): pp. 73-78.
Kuo et al. "Seed-Mediated Synthesis of Monodispersed Cu2O Nanocubes with Five Different Size Ranges from 40 to 420 nm", Adv Func Mat (2007) 17: pp. 3773-3780.
Li et al. "Complex chemistry & the Electroless Copper Plating Process", Plating & Surface Finishing (2004):40-46, American Electroplaters and Surface Finishers Society.
Li, H., et al., "The crystal structural evolution of nano-Si anode caused by lithium insertion and extraction at room temperature", Solid State Ionics, vol. 135, Issues 1-4, Nov. 2000, pp. 181-191; NH Elsevier.
Liu et al. "Modification of synthetic graphite for secondary lithium-ion battery applications", J Power Sources (1999) 81-82:187-191.
Liu, Y., et al., "Novel negative electrode materials with high capacity density for further rechargeable lithium ion batteries", Res. Rep. Fac. Eng. Mie Univ., vol. 29, Oct. 20, 2004; pp. 65-72.
Lu et al. "Electrochemical and thermal behavior of copper coated type MAG-20 natural graphite", Electrochemica Acta (2002) 47(10):1601-1606, International Society of Electrochemistry.
Manna, L. et al. "Epitaxial growth and photochemical annealing of graded CdS/ZnS shells on colloidal CdSe nanorods", J. Am. Chem. Soc. (2002) 124:7136-7145.

(56) References Cited

OTHER PUBLICATIONS

Mei L.P. et al., "A Glassy Carbon Electrode Modified with Porous Cu2O Nanospheres on Reduced Graphene Oxide Support for Simultaneous Sensing of Uric Acid an Dopamine with High Selectivity Over Ascorbic Acid", Microchim Acta (2016) 183: pp. 2039-2046.
Morales, A.M. et al., "A laser ablation method for the synthesis of crystalline semiconductor nanowires", Science (1998) 279:208-211.
Peng, X. et al. "Epitaxial growth of highly luminescent CdSe/CdS core/shell nanocrystals with photostability and electronic accessibility", J. Am. Chem. Soc. (1997) 119:7019-7029.
Peng, X. et al. "Shape control of CdSe nanocrystals", Nature (2000) 404:59-61.
Puntes, V.F. et al., "Colloidal nanocrystal shape and size control: The case of cobalt", Science (2001) 291:2115-2117.
Qian et al. "Synthesis of Germanium/Multi-walled Carbon Nanotube Core-Sheath Structures via Chemical Vapor Deposition", Nanowires Sci & Tech (2010) pp. 113-130, INTECH.
Renard et al. "Catalyst preparation for CMOS-compatible silicon nanowire synthesis", Nature Nanotech (2009) 4:654-657.
Siperko "Scanning tunneling microscopy studies of Pd—Sn catalyzed electroless Cu deposited on pyrolytic graphite", J Vacuum Sci & Tech A (1991) 9(3):1457-1460.
Szczech J.R. et al., "Nanostructured Silicon for High Capacity Lithium Battery Anodes", Energy Environ. Sci., 2011, 4, pp. 56-72.
Szczech J.R. et al., "Nanostructured Silicon for High Capacity Lithium Battery Anodes", Table ESI 1-7; Department of Chemistry, University of Wisconsin-Madison, 1101 University Avenue, Madison, Wisconsin, 53706; 2011, 2 pp., USA.
Urban, J.J. et al. "Synthesis of single-crystalline perovskite nanowires composed of barium titanate and strontium titanate", J. Am. Chem. Soc. (2002) 124(7):1186-1187.
Wu et al., "Block-by-Block Growth of Single-Crystalline Si/SiGe Superlative Nanowires", Nano Letters, 2002, No. 2, vol. 2, pp. 83-86.
Xiong, Yujie, et al., "From Complex Chains to 1D Metal Oxides: A Novel Strategy to $Cu_2O$ Nanowires", J. Phys. Chem. B, vol. 107, No. 16, 2003, pp. 3697-3702.
Xu et al. "Preparation of copper nanoparticles on carbon nanotubes by electroless plating method", Mat Res Bulletin (2004) 39:1449-1505.
Yang, J., et al., "Si/C Composites for High Capacity Lithium Storage Materials", Electrochemical and Solid-State Letters, vol. 6, Issue 8, Aug. 1, 2003; pp. A154-A156.
Yin et al. "Copper Oxide Nanocrystals", J Am Chem Soc (2005) vol. 127, pp. 9506-9511.
Yu "A novel processing technology of electroless copper plating on graphite powder", Mat Protection (2007) 40(9): pp. 25-27.
Yu et al. "Synthesis and Characterization of Monodispersed Copper Colloids in Polar Solvents", Nanoscale Res Lett (2009) 4: pp. 465-470.
Yun et al., "Ferroelectric Properties of Individual Barium Titanate Nanowires Investigated by Scanned Probe Microscopy", Nano Letters, 2002, vol. 2, No. 5, pp. 447-450.
Zuo, P., et al., "Electrochemical stability of silicon/carbon composite anode for lithium ion batteries", Electrochimica Acta, vol. 52, Issue 15, Apr. 20, 2007; pp. 4878-4883.
Notification of Reexamination issued by SIPO on Mar. 29, 2017 (Year: 2017).
Notice of Allowance in U.S. Appl. No. 18/111,549, mailed Jan. 26, 2024, 8 pp.
Corrected Notice of Allowance in U.S. Appl. No. 18/111,549, mailed Feb. 20, 2024, 5 pp.
Corrected Notice of Allowance in U.S. Appl. No. 18/111,549, mailed Feb. 26, 2024, 5 pp.
Extended European Search Report in EP application No. 24163989.7 dated Jun. 5, 2024.
Extended European Search Report in EP application No. 24163995.4 dated Aug. 29, 2024.
Office Action in U.S. Appl. No. 18/607,552, mailed Sep. 27, 2024 (14 pp.).

\* cited by examiner

NANOSTRUCTURED BATTERY ACTIVE MATERIALS AND METHODS OF PRODUCING SAME

CROSS-REFERENCE TO RELATED APPLICATION

This application is a continuation of U.S. patent application Ser. No. 18/111,549, entitled "NANOSTRUCTURED BATTERY ACTIVE MATERIALS AND METHODS OF PRODUCING SAME" which was filed on Feb. 18, 2023, currently pending, which is a continuation of U.S. patent application Ser. No. 16/355,454, entitled "NANOSTRUCTURED BATTERY ACTIVE MATERIALS AND METHODS OF PRODUCING SAME" which was filed on Mar. 15, 2019, now U.S. Pat. No. 11,616,225, which is a continuation of U.S. patent application Ser. No. 14/234,565, entitled "NANOSTRUCTURED BATTERY ACTIVE MATERIALS AND METHODS OF PRODUCING SAME" which was filed on Jul. 24, 2014, now U.S. Pat. No. 10,243,207, which is a U.S. National Stage Application filed under 35 U.S.C. § 371 of International Application No. PCT/US2012/047979, entitled "NANOSTRUCTURED BATTERY ACTIVE MATERIALS AND METHODS OF PRODUCING SAME" which was filed on Jul. 24, 2012, which claims the benefit of U.S. Provisional Application No. 61/511,826, filed on Jul. 26, 2011, which is incorporated herein by reference in its entirety.

FIELD OF THE INVENTION

The invention pertains to the field of nanotechnology. More particularly, the invention relates to methods for producing nanostructures from copper-based catalyst materials, particularly silicon nanostructures on carbon-based substrates for use as battery active materials. The invention also relates to compositions including silicon nanowires on porous substrates, particularly carbon-based substrates that can serve as battery active materials.

BACKGROUND OF THE INVENTION

Silicon nanowires are desirable materials for many applications in the semiconductor industry, as well as in production of medical devices and high capacity lithium-ion batteries. Gold nanoparticles have been extensively used to catalyze growth of silicon nanowires. However, the cost of gold becomes significant or even prohibitive for large scale synthesis of silicon nanowires, and gold is not compatible with all desired applications for the nanowires.

Methods for silicon nanostructure growth that reduce or even eliminate the need for a gold catalyst are thus desirable. Among other aspects, the present invention provides such methods. A complete understanding of the invention will be obtained upon review of the following.

SUMMARY OF THE INVENTION

Methods for producing nanostructures from copper-based catalysts on porous substrates, particularly silicon nanowires on carbon-based substrates for use as battery active materials, are provided. Compositions including such nanostructures are described. Novel methods for production of copper-based catalyst particles are also provided.

One general class of embodiments provides methods for producing nanostructures. In the methods, a porous substrate having catalyst particles disposed thereon is provided, and the nanostructures are grown from the catalyst particles. The catalyst particles comprise copper, a copper compound, and/or a copper alloy.

The substrate can comprise, e.g., a carbon-based substrate, a population of particles, a population of graphite particles, a plurality of silica particles, a plurality of carbon sheets, carbon powder, natural and/or artificial graphite, graphene, graphene powder, carbon fibers, carbon nanostructures, carbon nanotubes, carbon black, a mesh, or a fabric. In one class of embodiments, the substrate comprises a population of graphite particles and the nanostructures are silicon nanowires.

The catalyst particles can be of essentially any desired size but are typically nanoparticles. For example, the catalyst particles optionally have an average diameter between about 5 nm and about 100 nm, e.g., between about 20 nm and about 50 nm, e.g., between about 20 nm and about 40 nm.

As noted above, the catalyst particles can comprise copper, a copper compound, and/or a copper alloy. For example, the catalyst particles can comprise copper oxide. In one class of embodiments, the catalyst particles comprise copper (I) oxide ($Cu_2O$), copper (II) oxide (CuO), or a combination thereof. In one class of embodiments, the catalyst particles comprise elemental (i.e., pure-phase) copper (Cu), copper (I) oxide ($Cu_2O$), copper (II) oxide (CuO), or a combination thereof. In another class of embodiments, the catalyst particles comprise copper acetate, copper nitrate, or a copper complex comprising a chelating agent (e.g., copper tartrate or copper EDTA).

Catalyst particles can be produced and disposed on the substrate by essentially any convenient techniques, including, but not limited to, colloidal synthesis followed by deposition, adsorption of copper ions or complexes, and electroless deposition. Thus, in one class of embodiments, providing a porous substrate having catalyst particles disposed thereon comprises synthesizing colloidal nanoparticles comprising copper and/or a copper compound and then depositing the nanoparticles on the substrate. The nanoparticles optionally comprise elemental copper (Cu), copper (I) oxide ($Cu_2O$), copper (II) oxide (CuO), or a combination thereof, and the substrate optionally comprises a population of graphite particles. In another class of embodiments, providing a porous substrate having catalyst particles disposed thereon comprises synthesizing discrete particles on the substrate through electroless deposition of copper onto the substrate, by immersing the substrate in an electroless plating solution comprising copper ions (e.g., at most 10 millimolar copper ions) and a reducing agent (e.g., formaldehyde). The plating solution is typically alkaline. The substrate optionally comprises a population of graphite particles. In another class of embodiments, providing a porous substrate having catalyst particles disposed thereon comprises immersing the porous substrate in a solution comprising copper ions and/or a copper complex, whereby the copper ions and/or the copper complex are adsorbed on the surface of the substrate, thereby forming discrete nanoparticles on the surface of the substrate. The solution is typically an aqueous alkaline solution. The substrate optionally comprises a population of graphite particles.

The methods can be used to synthesize essentially any desired type of nanostructures, including, but not limited to, nanowires. The nanowires can be of essentially any desired size. For example, the nanowires can have an average diameter less than about 150 nm, e.g., between about 10 nm and about 100 nm, e.g., between about 30 nm and about 50 nm.

The nanostructures can be produced from any suitable material, including, but not limited to, silicon. In embodiments in which the nanostructures comprise silicon, the nanostructures can comprise, e.g., monocrystalline silicon, polycrystalline silicon, amorphous silicon, or a combination thereof. Thus, in one class of embodiments, the nanostructures comprise a monocrystalline core and a shell layer, wherein the shell layer comprises amorphous silicon, polycrystalline silicon, or a combination thereof. In one aspect, the nanostructures are silicon nanowires.

The nanostructures can be grown using essentially any convenient technique. For example, silicon nanowires can be grown via a vapor-liquid-solid (VLS) or vapor-solid-solid (VSS) technique.

The methods can be employed for production of nanostructures for use in any of a variety of different applications. For example, the nanostructures and the substrate on which they were grown can be incorporated into a battery slurry, battery anode, and/or battery, e.g., a lithium ion battery.

In one class of embodiments, the substrate comprises a population of graphite particles and the nanostructures comprise silicon nanowires, and silicon comprises between 2% and 20% of the total weight of the nanostructures and the graphite particles after nanostructure growth is completed.

Another general class of embodiments provides methods for producing silicon nanowires. In the methods, colloidal nanoparticles comprising copper and/or a copper compound are synthesized and deposited on a substrate, and the nanowires are grown from the nanoparticles.

The copper compound is optionally copper oxide. In one class of embodiments, the nanoparticles comprise elemental copper (Cu), copper (I) oxide ($Cu_2O$), copper (II) oxide (CuO), or a combination thereof. The size of the nanoparticles can vary, for example, depending on the diameter desired for the resulting nanowires. For example, the nanoparticles optionally have an average diameter between about 5 nm and about 100 nm, e.g., between about 10 nm and about 100 nm, between about 20 nm and about 50 nm, or between about 20 nm and about 40 nm.

Essentially all of the features noted for the embodiments above apply to these embodiments as well, as relevant: for example, with respect to type and composition of substrate (e.g., a population of graphite particles), nanostructure growth technique (e.g., VLS or VSS), type, composition, and size of the resulting nanostructures, ratio of nanostructures to substrate (e.g., silicon to graphite) by weight, incorporation into a battery slurry, battery anode, or battery, and/or the like.

Another general class of embodiments provides methods for producing nanoparticles by electroless deposition. In the methods, a substrate is provided. Also provided is an electroless plating solution that comprises at most 10 millimolar copper ions (e.g., $Cu^{2+}$ and/or $Cu^+$). The substrate is immersed in the plating solution, whereby the copper ions from the plating solution form discrete nanoparticles comprising copper and/or a copper compound on the substrate, until the plating solution is substantially completely depleted of copper ions.

Suitable substrates include planar substrates, silicon wafers, foils, and nonporous substrates, in addition to porous substrates such as those described above, e.g., a population of particles, e.g., a population of graphite particles.

The substrate is typically activated prior to its immersion in the electroless plating solution. The substrate is optionally activated by soaking it in a solution of a metal salt, e.g., $PdCl_2$ or $AgNO_3$. Graphite substrates, however, particularly graphite particles which have a high surface area, are conveniently activated simply by heating them prior to immersion in the plating solution. Thus, in one class of embodiments the substrate comprises a population of graphite particles, which are activated by heating to 20° C. or more (preferably 40° C. or more) prior to immersion in the plating solution.

In embodiments in which the substrate comprises a population of particles, the methods can include filtering the plating solution to recover the substrate particles from the plating solution after the plating solution is substantially completely depleted of copper ions.

The plating solution can include a copper salt, e.g., a copper (II) salt, as the copper source. The plating solution can include, e.g., one or more of Rochelle salt, EDTA, and N,N,N',N'-tetrakis (2-hydroxypropyl) ethylene-diamine) as a chelating agent. The plating solution can include, e.g., formaldehyde or sodium hypophosphite as the reducing agents. In one exemplary class of embodiments, the plating solution comprises a copper (II) salt, Rochelle salt, and formaldehyde and has an alkaline pH.

As noted, the resulting nanoparticles can include copper or a copper compound (for example, copper oxide). In one class of embodiments, the nanoparticles comprise elemental copper (Cu), copper (I) oxide ($Cu_2O$), copper (II) oxide (CuO), or a combination thereof. The resulting nanoparticles optionally have an average diameter between about 5 nm and about 100 nm, e.g., between about 10 nm and about 100 nm, between about 20 nm and about 50 nm, or between about 20 nm and about 40 nm.

The resulting nanoparticles are optionally employed as catalyst particles for subsequent synthesis of other nanostructures, e.g., nanowires. Thus, the methods can include, after the plating solution is substantially completely depleted of copper ions, removing the substrate from the plating solution and then growing nanostructures (e.g., nanowires, e.g., silicon nanowires) from the nanoparticles on the substrate.

Essentially all of the features noted for the embodiments above apply to these embodiments as well, as relevant: for example, with respect to nanostructure growth technique (e.g., VLS or VSS), type, composition, and size of the resulting nanostructures, ratio of nanostructures to substrate (e.g., silicon to graphite) by weight, incorporation into a battery slurry, battery anode, or battery, and/or the like.

The plating solution can be employed as a single use bath or as a reusable bath. Thus, in one class of embodiments, after the plating solution is substantially completely depleted of copper ions, the substrate is removed from the plating solution, then copper ions are added to the plating solution (e.g., by addition of a copper (II) salt), and then a second substrate is immersed in the plating solution. Typically, after addition of the copper ions, the plating solution again comprises at most 10 millimolar copper ions. The second substrate is typically but need not be of the same type as the first substrate, e.g., a second population of particles, e.g., graphite particles.

In embodiments in which the plating solution comprises formaldehyde, after the plating solution is substantially completely depleted of copper ions the formaldehyde can be treated by addition of sodium sulfite to the plating solution prior to disposing of the solution.

As noted, nanoparticles produced by electroless deposition can be employed as catalyst particles in subsequent nanostructure synthesis reactions. Accordingly, one general class of embodiments provides methods for producing nanowires. In the methods, a substrate is provided. An electroless plating solution comprising copper ions is also provided, and the substrate is immersed in the plating solution, whereby the copper ions from the plating solution form discrete nanoparticles comprising copper and/or a copper compound on the substrate. Nanowires are then grown from the nanoparticles on the substrate.

Essentially all of the features noted for the embodiments above apply to these embodiments as well, as relevant: for example, with respect to type and composition of substrate (nonporous, porous, particles, graphite particles, sheets, wafers, etc.), activation of the substrate, size, shape, and composition of the nanoparticles (e.g., elemental copper and/or copper oxide), components of the plating solution (copper source and reducing, chelating, and other reagents), filtration step to recover a particulate substrate, reuse versus single use of the plating solution, nanostructure growth technique (e.g., VLS or VSS), type, composition, and size of the resulting nanostructures, ratio of nanostructures to substrate (e.g., silicon to graphite) by weight, incorporation into a battery slurry, battery anode, or battery, and/or the like.

Nanoparticles produced by adsorption can be employed as catalyst particles in subsequent nanostructure synthesis reactions. Accordingly, another general class of embodiments provides methods for producing silicon nanowires. In the methods, a solution is provided. A solution comprising copper ions and/or a copper complex is also provided, and the substrate is immersed in the solution, whereby the copper ions and/or the copper complex are adsorbed on the surface of the substrate, thereby forming discrete nanoparticles comprising a copper compound on the surface of the substrate. The nanowires are then grown from the nanoparticles on the substrate.

The solution optionally includes a copper (II) salt (e.g., copper sulfate, copper acetate, or copper nitrate) and/or a copper complex comprising a chelating agent (e.g., copper (II) tartrate or copper EDTA). The solution can be an aqueous solution, typically, an alkaline solution.

The size of the nanoparticles can vary, for example, depending on the diameter desired for the resulting nanowires. For example, the nanoparticles optionally have an average diameter between about 5 nm and about 100 nm.

Essentially all of the features noted for the embodiments above apply to these embodiments as well, as relevant: for example, with respect to type and composition of substrate (e.g., a population of graphite particles), nanostructure growth technique (e.g., VLS or VSS), composition and size of the resulting nanowires, ratio of nanowires to substrate (e.g., silicon to graphite) by weight, incorporation into a battery slurry, battery anode, or battery, and/or the like.

Compositions produced by or useful in practicing any of the methods herein are also a feature of the invention. Accordingly, one general class of embodiments provides a composition that includes a porous substrate and a population of silicon nanowires attached thereto, wherein one end of a member nanowire is attached to the substrate and the other end of the member nanowire comprises copper, a copper compound, and/or a copper alloy.

Essentially all of the features noted for the embodiments above apply to these embodiments as well, as relevant: for example, with respect to type, composition, and size of nanostructures, composition and configuration of the substrate, catalyst material, incorporation into a battery slurry, battery anode, or battery, and/or the like.

For example, the composition can include nanowires having an average diameter between about 10 nm and about 100 nm, e.g., between about 30 nm and about 50 nm, e.g., between about 40 nm and about 45 nm. The nanowires can comprise monocrystalline silicon, polycrystalline silicon, amorphous silicon, or a combination thereof. For example, the nanowires optionally comprise a monocrystalline core and a shell layer, wherein the shell layer comprises amorphous silicon, polycrystalline silicon, or a combination thereof.

As for the embodiments above, the porous substrate is optionally a carbon-based substrate, a population of particles, a plurality of silica particles, a plurality of carbon sheets, carbon powder, natural and/or artificial graphite, a population of natural and/or artificial graphite particles, graphene, graphene powder, carbon fibers, carbon nanostructures, carbon nanotubes, carbon black, a mesh, or a fabric.

The catalyst-derived material on the ends of the member nanowires not attached to the substrate can comprise, e.g., elemental copper, copper oxide, copper silicide, or a combination thereof.

The composition optionally includes a polymer binder, e.g., carboxymethyl cellulose. In one class of embodiments, the substrate comprises a population of graphite particles, and silicon comprises between 2% and 20% of the total weight of the nanostructures and the graphite particles.

A battery slurry, battery anode, or battery comprising the composition is also a feature of the invention.

Figure 1B:
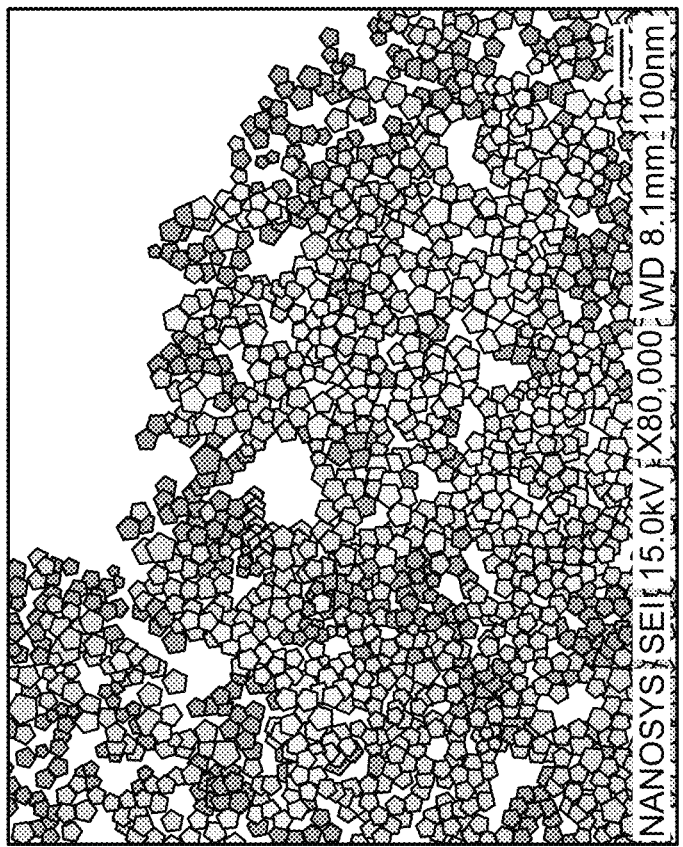
FIG. 1 Panels A and B show scanning electron micrographs of colloidal $Cu_2O$ nanoparticles synthesized in an aqueous medium.

Schematic figures are not necessarily to scale.

Definitions

Unless defined otherwise, all technical and scientific terms used herein have the same meaning as commonly understood by one of ordinary skill in the art to which the invention pertains. The following definitions supplement those in the art and are directed to the current application and are not to be imputed to any related or unrelated case, e.g., to any commonly owned patent or application. Although any methods and materials similar or equivalent to those described herein can be used in the practice for testing of the present invention, the preferred materials and methods are described herein. Accordingly, the terminology used herein is for the purpose of describing particular embodiments only, and is not intended to be limiting.

As used in this specification and the appended claims, the singular forms "a," "an" and "the" include plural referents unless the context clearly dictates otherwise. Thus, for example, reference to "a nanostructure" includes a plurality of such nanostructures, and the like.

The term "about" as used herein indicates the value of a given quantity varies by +/−10% of the value, or optionally +/−5% of the value, or in some embodiments, by +/−1% of the value so described.

A "nanostructure" is a structure having at least one region or characteristic dimension with a dimension of less than about 500 nm, e.g., less than about 200 nm, less than about 100 nm, less than about 50 nm, or even less than about 20 nm. Typically, the region or characteristic dimension will be along the smallest axis of the structure. Examples of such structures include nanowires, nanorods, nanotubes, nanofibers, branched nanostructures, nanotetrapods, tripods, bipods, nanocrystals, nanodots, quantum dots, nanoparticles, and the like. Nanostructures can be, e.g., substantially crystalline, substantially monocrystalline, polycrystalline, amorphous, or a combination thereof. In one aspect, each of the three dimensions of the nanostructure has a dimension of less than about 500 nm, e.g., less than about 200 nm, less than about 100 nm, less than about 50 nm, or even less than about 20 nm.

An "aspect ratio" is the length of a first axis of a nanostructure divided by the average of the lengths of the second and third axes of the nanostructure, where the second and third axes are the two axes whose lengths are most nearly equal each other. For example, the aspect ratio for a perfect rod would be the length of its long axis divided by the diameter of a cross-section perpendicular to (normal to) the long axis.

As used herein, the "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure: e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

A "nanocrystal" is a nanostructure that is substantially monocrystalline. A nanocrystal thus has at least one region or characteristic dimension with a dimension of less than about 500 nm, e.g., less than about 200 nm, less than about 100 nm, less than about 50 nm, or even less than about 20 nm. The term "nanocrystal" is intended to encompass substantially monocrystalline nanostructures comprising various defects, stacking faults, atomic substitutions, and the like, as well as substantially monocrystalline nanostructures without such defects, faults, or substitutions. In the case of nanocrystal heterostructures comprising a core and one or more shells, the core of the nanocrystal is typically substantially monocrystalline, but the shell(s) need not be. In one aspect, each of the three dimensions of the nanocrystal has a dimension of less than about 500 nm, e.g., less than about 200 nm, less than about 100 nm, less than about 50 nm, or even less than about 20 nm. Examples of nanocrystals include, but are not limited to, substantially spherical nanocrystals, branched nanocrystals, and substantially monocrystalline nanowires, nanorods, nanodots, quantum dots, nanotetrapods, tripods, bipods, and branched tetrapods (e.g., inorganic dendrimers).

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. (A shell can but need not completely cover the adjacent materials to be considered a shell or for the nanostructure to be considered a heterostructure: for example, a nanocrystal characterized by a core of one material covered with small islands of a second material is a heterostructure.) In other embodiments, the different material types are distributed at different locations within the nanostructure: e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

A "nanoparticle" is a nanostructure in which each dimension (e.g., each of the nanostructure's three dimensions) is less than about 500 nm, e.g., less than about 200 nm, less than about 100 nm, less than about 50 nm, or even less than about 20 nm. Nanoparticles can be of any shape, and include, for example, nanocrystals, substantially spherical particles (having an aspect ratio of about 0.8 to about 1.2), and irregularly shaped particles. Nanoparticles optionally have an aspect ratio less than about 1.5. Nanoparticles can be amorphous, crystalline, monocrystalline, partially crystalline, polycrystalline, or otherwise. Nanoparticles can be substantially homogeneous in material properties, or in certain embodiments can be heterogeneous (e.g., heterostructures). Nanoparticles can be fabricated from essentially any convenient material or materials, e.g., the nanoparticles can comprise "pure" materials, substantially pure materials, doped materials and the like.

A "nanowire" is a nanostructure that has one principle axis that is longer than the other two principle axes. Consequently, the nanowire has an aspect ratio greater than one; nanowires of this invention typically have an aspect ratio greater than about 1.5 or greater than about 2. Short nanowires, sometimes referred to as nanorods, typically have an aspect ratio between about 1.5 and about 10. Longer nanowires have an aspect ratio greater than about 10, greater than about 20, greater than about 50, or greater than about 100, or even greater than about 10,000. The diameter of a nanowire is typically less than about 500 nm, preferably less than about 200 nm, more preferably less than about 150 nm, and most preferably less than about 100 nm, about 50 nm, or about 25 nm, or even less than about 10 nm or about 5 nm. The nanowires of this invention can be substantially homogeneous in material properties, or in certain embodiments can be heterogeneous (e.g., nanowire heterostructures). The nanowires can be fabricated from essentially any convenient material or materials. The nanowires can comprise "pure" materials, substantially pure materials, doped materials and the like, and can include insulators, conductors, and semiconductors. Nanowires are typically substantially crystalline and/or substantially monocrystalline, but can be, e.g., polycrystalline or amorphous. In some instances, a nanowire can bear an oxide or other coating, or can be comprised of a core and at least one shell. In such instances it will be appreciated that the oxide, shell(s), or other coating need not exhibit such ordering (e.g. it can be amorphous, polycrystalline, or otherwise). Nanowires can have a variable diameter or can have a substantially uniform diameter, that is, a diameter that shows a variance less than about 20% (e.g., less than about 10%, less than about 5%, or less than about 1%) over the region of greatest variability and over a linear dimension of at least 5 nm (e.g., at least 10 nm, at least 20 nm, or at least 50 nm). Typically the diameter is evaluated away from the ends of the nanowire (e.g., over the central 20%, 40%, 50%, or 80% of the nanowire). A nanowire can be straight or can be, e.g., curved or bent, over the entire length of its long axis or a portion thereof. In certain embodiments, a nanowire or a portion thereof can exhibit two- or three-dimensional quantum confinement. Nanowires according to this invention can expressly exclude carbon nanotubes, and, in certain embodiments, exclude "whiskers" or "nanowhiskers", particularly whiskers having a diameter greater than 100 nm, or greater than about 200 nm.

A "substantially spherical nanoparticle" is a nanoparticle with an aspect ratio between about 0.8 and about 1.2. Similarly, a "substantially spherical nanocrystal" is a nanocrystal with an aspect ratio between about 0.8 and about 1.2.

A "catalyst particle" or "nanostructure catalyst" is a material that facilitates the formation or growth of a nanostructure. The term is used herein as it is commonly used in the art relevant to nanostructure growth; thus, use of the word "catalyst" does not necessarily imply that the chemical composition of the catalyst particle as initially supplied in a nanostructure growth reaction is identical to that involved in the active growth process of the nanostructure and/or recovered when growth is halted. For example, when gold nanoparticles are used as catalyst particles for silicon nanowire growth, particles of elemental gold are disposed on a substrate and elemental gold is present at the tip of the nanowire after synthesis, though during synthesis the gold exists as a eutectic phase with silicon. As a contrasting example, without limitation to any particular mechanism, when copper nanoparticles are used for VLS or VSS nanowire growth, particles of elemental copper are disposed on a substrate, and copper silicide may be present at the tip of the nanowire during and after synthesis. As yet another example, again without limitation to any particular mechanism, when copper oxide nanoparticles are used as catalyst particles for silicon nanowire growth, copper oxide particles are disposed on a substrate, but they may be reduced to elemental copper in a reducing atmosphere employed for nanowire growth and copper silicide may be present at the tip of the nanowire during and after nanowire synthesis. Both situations in which the catalyst material maintains the identical chemical composition and situations in which the catalyst material changes in chemical composition are explicitly included by used of the terms "catalyst particle" or "nanostructure catalyst" herein. Catalyst particles are typically nanoparticles, particularly discrete nanoparticles. Catalyst particles are distinct from precursors employed during nanostructure growth, in that precursors, in contrast to the catalyst particles, serve as a source for at least one type of atom that is incorporated throughout the nanostructure (or throughout a core, shell, or other region of a nanostructure heterostructure).

A "compound" or "chemical compound" is a chemical substance consisting of two or more different chemical elements and having a unique and defined chemical structure, including, e.g., molecular compounds held together by covalent bonds, salts held together by ionic bonds, intermetallic compounds held together by metallic bonds, and complexes held together by coordinate covalent bonds.

An "alloy" is a metallic solid solution (complete or partial) composed of two or more elements. A complete solid solution alloy has a single solid phase microstructure, while a partial solution alloy has two or more phases that may or may not be homogeneous in distribution.

A "porous" substrate contains pores or voids. In certain embodiments, a porous substrate can be an array or population of particles, e.g., a random close pack particle population or a dispersed particle population. The particles can be of essentially any desired size and/or shape, e.g., spherical, elongated, oval/oblong, plate-like (e.g., plates, flakes, or sheets), or the like. The individual particles can themselves be nonporous or can be porous (e.g., include a capillary network through their structure). When employed for nanostructure growth, the particles can be but typically are not cross-linked. In other embodiments, a porous substrate can be a mesh or fabric.

A "carbon-based substrate" refers to a substrate that comprises at least about 50% carbon by mass. Suitably, a carbon-based substrate comprises at least about 60% carbon, 70% carbon, 80% carbon, 90% carbon, 95% carbon, or about 100% carbon by mass, including 100% carbon. Exemplary carbon-based substrates that can be used in the practice of the present invention include, but are not limited to, carbon powder, such as carbon black, fullerene soot, desulfurized carbon black, graphite, graphite powder, graphene, graphene powder, or graphite foil. As used throughout, "carbon black" refers to the material produced by the incomplete combustion of petroleum products. Carbon black is a form of amorphous carbon that has an extremely high surface area to volume ratio. "Graphene" refers to a single atomic layer of carbon formed as a sheet, and can be prepared as graphene powders. See, e.g., U.S. Pat. Nos. 5,677,082, 6,303,266 and 6,479,030, the disclosures of each of which are incorporated by reference herein in their entireties. Carbon-based substrates specifically exclude metallic materials, such as steel, including stainless steel. Carbon-based substrates can be in the form of sheets or separate particles, as well as cross-linked structures.

Unless clearly indicated otherwise, ranges listed herein are inclusive.

A variety of additional terms are defined or otherwise characterized herein.

DETAILED DESCRIPTION

Traditional batteries, including lithium ion batteries, comprise an anode, an electrolyte, a cathode, and typically a separator. The anode of most commercially available lithium ion batteries is copper foil coated with a mixture of graphite powder and a polymer blend. The capacity of these materials is limited, however. There is therefore need for improved anode materials with greater storage capacity.

Silicon has a high theoretical specific capacity for lithium (Li) storage (approximately 4200 mAh/g). However, silicon also experiences a large volume change on lithiation or delithiation that renders bulk silicon impractical for use in battery active materials. Incorporation of silicon nanowires into anodes can minimize the mechanical stress associated with lithium ion insertion and extraction. The use of silicon nanowires in anodes also provides very high silicon surface area and thus high charging rates. For additional information on incorporation of silicon into battery anodes, see, e.g., U.S. patent application publication no. 2010/0297502 by Zhu et al. entitled "Nanostructured materials for battery applications" and references therein, each of which is incorporated by reference herein in its entirety. Chen et al. (2011) "Hybrid silicon-carbon nanostructured composites as superior anodes for lithium ion batteries" Nano Res. 4(3):290-296, Cui et al. (2009) "Carbon-silicon core-shell nanowires as high capacity electrode for lithium ion batteries" Nano Letters 9(9)3370-3374, Chen et al. (2010) "Silicon nanowires with and without carbon coating as anode materials for lithium-ion batteries" J Solid State Electrochem 14:1829-1834, and Chan et al. (2010) "Solution-grown silicon nanowires for lithium-ion battery anodes" ACS Nano 4(3): 1443-1450.

Widespread adoption of lithium ion batteries including silicon nanowire-based anodes, however, requires large scale synthesis of silicon nanowires. Currently, silicon nanowires are typically grown using gold catalyst particles, for example, in a vapor-liquid-solid (VLS), chemical vapor deposition (CVD) process in which a feed gas (e.g., silane) is used as the source material. Gold catalyst on a heated solid substrate is exposed to the feed gas, liquifies, and absorbs the Si vapor to supersaturation levels. Nanostructure growth occurs at the liquid-solid interface. See, e.g., U.S. Pat. No. 7,301,199 to Lieber et al. entitled "Nanoscale wires and related devices," U.S. Pat. No. 7,211,464 to Lieber et al. entitled "Doped elongated semiconductors, growing such semiconductors, devices including such semiconductors and fabricating such devices," Cui et al. (2001) "Diameter-controlled synthesis of single-crystal silicon nanowires" Appl. Phys. Lett. 78, 2214-2216, and Morales et al. (1998) "A laser ablation method for the synthesis of crystalline semiconductor nanowires" Science 279, 208-211.

However, the cost of gold becomes significant when large scale synthesis of silicon nanowires is contemplated. Additionally, the liquid state of Au—Si at the eutectic temperature can cause uncontrollable deposition of gold-based catalyst material and subsequent silicon growth at undesired locations such as on the substrate or the sidewalls of the nanowires. Furthermore, gold is not compatible with semiconductor processing and is prohibited in industrial clean rooms, which raises additional difficulties for gold catalyzed synthesis of nanowires intended for such applications.

In one aspect, the present invention overcomes the above noted difficulties by providing methods of producing nanostructures (including silicon nanowires) that reduce or even eliminate need for a gold catalyst. For example, methods for growing silicon nanowires from core-shell nanoparticles having a gold shell are provided that reduce the amount of gold required for nanostructure synthesis, as compared to traditional synthesis techniques using solid gold nanoparticle catalysts. As another example, methods for growing silicon nanowires and other nanostructures from copper-based catalysts are provided that eliminate any need for a gold catalyst. The methods optionally include growing the nanostructures on a carbon-based porous substrate suitable for incorporation into a battery anode. Compositions, battery slurries, battery anodes, and batteries including nanostructures grown on such substrates from copper-based catalysts are also described. In addition, methods for production of nanoparticles including copper or a copper compound and suitable for use as nanostructure catalysts are provided.

Nanostructure Growth Using Copper-Based Catalyst Materials

Although growth of silicon nanowires from copper-based catalysts has been described in U.S. Pat. No. 7,825,036 to Yao et al. entitled "Method of synthesizing silicon wires" and Renard et al. (2010) "Catalyst preparation for CMOS-compatible silicon nanowire synthesis" Nature Nanotech 4:654-657, these methods produce nanowires on planar solid substrates not suitable for use as a battery active material or amenable to scaling up for production of large quantities of nanowires. In contrast, one aspect of the present invention provides methods for growth of nanostructures (including but not limited to silicon nanowires) on porous or particulate substrates, including substrates that are suitable for use in batteries and/or that facilitate large-scale nanostructure synthesis.

Thus, one general class of embodiments provides methods for producing nanostructures. In the methods, a porous substrate having catalyst particles disposed thereon is provided, and the nanostructures are grown from the catalyst particles. The catalyst particles comprise copper, a copper compound, and/or a copper alloy.

The porous substrate is optionally a mesh, fabric, e.g., a woven fabric (e.g., a carbon fabric), or fibrous mat. In preferred embodiments, the substrate comprises a population of particles, sheets, fibers (including, e.g., nanofibers), and/or the like. Thus, exemplary substrates include a plurality of silica particles (e.g., a silica powder), a plurality of carbon sheets, carbon powder (a plurality of carbon particles), natural and/or artificial (synthetic) graphite, natural and/or artificial (synthetic) graphite particles, graphene, graphene powder (a plurality of graphene particles), carbon fibers, carbon nanostructures, carbon nanotubes, and carbon black. For synthesis of nanostructures, e.g., silicon nanowires, for use as a battery active material, the substrate is typically a carbon-based substrate, for example, a population of graphite particles. Suitable graphite particles are commercially available, for example, from Hitachi Chemical Co., Ltd. (Ibaraki, Japan, e.g., MAG D-13 artificial graphite).

In embodiments in which the substrate comprises a population of particles (e.g., graphite particles), the particles can be of essentially any desired shape, for example, spherical or substantially spherical, elongated, oval/oblong, plate-like (e.g., plates, flakes, or sheets), and/or the like. Similarly, the substrate particles (e.g., graphite particles) can be of essentially any size. Optionally, the substrate particles have an average diameter between about 0.5 µm and about 50 µm, e.g., between about 0.5 µm and about 2 µm, between about 2 µm and about 10 µm, between about 2 µm and about 5 µm, between about 5 µm and about 50 µm, between about 10 µm and about 30 µm, between about 10 µm and about 20 µm, between about 15 µm and about 25 µm, between about 15 µm and about 20 µm, or about 20 µm. As will be evident, the size of the substrate particles can be influenced by the application ultimately desired for the resulting nanostructures. For example, where silicon nanostructures (e.g., silicon nanowires) are being synthesized on a population of graphite particles as the substrate, the graphite particle size is optionally about 10-20 µm (e.g., about 15-20 µm) where the graphite particles and silicon nanostructures are to be incorporated into a battery where high storage capacity is desired, whereas graphite particle size is optionally a few µm (e.g., about 5 µm or less) where the graphite particles and silicon nanostructures are to be incorporated into a battery capable of delivering high current or power. For the latter application, spherical graphite particles are optionally employed to achieve higher particle density.

The catalyst particles are disposed on the surface of the substrate. Thus, for example, where the substrate comprises a population of particles, the catalyst particles are disposed on the surface of individual substrate particles. Individual substrate particles can themselves be porous or nonporous. Where porous particles are employed as the substrate, the catalyst particles are typically disposed on the outer surface of the substrate particles, but can additionally or alternatively be disposed on the interior surface of micropores or channels within the substrate particles.

The catalyst particles can be of essentially any shape, including, but not limited to, spherical or substantially spherical, plate-like, oval/oblong, cubic, and/or irregular shapes (e.g., starfish-shaped). Similarly, the catalyst particles can be of essentially any desired size but are typically nanoparticles. For example, the catalyst particles optionally have an average diameter between about 5 nm and about 100 nm, e.g., between about 10 nm and about 100 nm, between about 20 nm and about 50 nm, or between about 20 nm and about 40 nm. Optionally, the catalyst particles have an average diameter of about 20 nm. As is known in the art, the size of the catalyst particles affects the size of the resulting nanostructures (e.g., the diameter of resulting nanowires).

As noted above, the catalyst particles can comprise copper, a copper compound, and/or a copper alloy. For example, the catalyst particles can comprise copper oxide, e.g., copper (I) oxide (cuprous oxide, $Cu_2O$), copper (II) oxide (cupric oxide, CuO), $Cu_2O_3$, $Cu_3O_4$, or a combination thereof. Thus, in one class of embodiments, the catalyst particles comprise copper (I) oxide ($Cu_2O$), copper (II) oxide (CuO), or a combination thereof. In one class of embodiments, the catalyst particles comprise elemental (i.e., pure-phase) copper (Cu), copper (I) oxide ($Cu_2O$), copper (II) oxide (CuO), or a combination thereof. In one class of embodiments, the catalyst particles comprise elemental copper and are substantially free of copper compounds (e.g., copper oxide) or alloys, e.g., as determined by x-ray diffraction (XRD) and/or energy-dispersive X-ray spectroscopy (EDS). In another class of embodiments, the catalyst particles consist essentially of copper oxide (e.g., $Cu_2O$ and/or CuO), e.g., as determined by XRD and/or EDS. In another class of embodiments, the catalyst particles comprise copper acetate, copper nitrate, or a copper complex comprising a chelating agent (e.g., copper tartrate or copper EDTA), preferably a copper (II) compound or complex. In one class of embodiments, the catalyst particles comprise a Cu—Ni alloy.

As noted above, the chemical composition of the catalyst particle as initially supplied in a nanostructure growth reaction may not be identical to that involved in the active growth process of the nanostructure and/or recovered when growth is halted. For example, when copper oxide nanoparticles are used as catalyst particles for silicon nanowire growth, copper oxide particles are disposed on a substrate, but they may be reduced to elemental copper in a reducing atmosphere employed for VSS nanowire growth and copper silicide may be present at the tip of the nanowire during and after such synthesis. As another example, when elemental copper nanoparticles are used as catalyst particles for silicon nanowire growth, copper particles are disposed on a substrate, but they may be oxidized to copper oxide in ambient atmosphere, then reduced to elemental copper in a reducing atmosphere employed for VSS nanowire growth, and copper silicide may be present at the tip of the nanowire during and after such synthesis. As yet another example, when nanoparticles comprising a copper compound such as copper acetate, copper nitrate, or a copper complex including a chelating agent are used as catalyst particles for silicon nanowire growth, they may decompose to form copper oxide when heated in ambient atmosphere and then be reduced to elemental copper in a reducing atmosphere employed for nanowire growth, and copper silicide may be present at the tip of the nanowire during and after such synthesis.

Catalyst particles can be produced and disposed on the substrate by essentially any convenient techniques, including, but not limited to, colloidal synthesis followed by deposition, adsorption of copper ions or complexes, or electroless deposition. Thus, in one class of embodiments, providing a porous substrate having catalyst particles disposed thereon comprises synthesizing colloidal nanoparticles comprising copper and/or a copper compound and then depositing the nanoparticles on the substrate. For additional details on colloidal synthesis of copper-based nanoparticles, see the section entitled "Colloidal Synthesis of Copper-Based Nanoparticles" hereinbelow. In another class of embodiments, providing a porous substrate having catalyst particles disposed thereon comprises synthesizing discrete particles on the substrate through electroless deposition of copper directly onto the substrate. For additional details on electroless deposition of copper-based nanoparticles, see the section entitled "Electroless Deposition of Copper-Based Nanoparticles" hereinbelow. In another class of embodiments, providing a porous substrate having catalyst particles disposed thereon comprises immersing the porous substrate in a solution comprising copper ions and/or a copper complex, whereby the copper ions and/or the copper complex are adsorbed on the surface of the substrate, thereby forming discrete nanoparticles on the surface of the substrate. For additional details on production of copper-based nanoparticles via adsorption, see the section entitled "Formation of Copper-Based Nanoparticles Through Adsorption" hereinbelow.

The methods can be used to synthesize essentially any desired type of nanostructures, including, but not limited to, nanowires, whiskers or nanowhiskers, nanofibers, nanotubes, tapered nanowires or spikes, nanodots, nanocrystals, branched nanostructures having three or more arms (e.g., nanotetrapods), or a combination of any of these.

The nanostructures can be produced from any suitable material, suitably an inorganic material, and more suitably an inorganic conductive or semiconductive material. Suitable semiconductor materials include, e.g., group II-VI, group III-V, group IV-VI, and group IV semiconductors. Suitable semiconductor materials include, but are not limited to, Si, Ge, Sn, Se, Te, B, C (including diamond), P, BN, BP, BAS, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, Bes, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $(Al, Ga, In)_2 (S, Se, Te)_3$, $Al_2CO$, and an appropriate combination of two or more such semiconductors.

In one aspect, for example, where the resulting nanostructures are to be incorporated into a lithium ion battery, the nanostructures comprise germanium, silicon, or a combination thereof. In embodiments in which the nanostructures comprise silicon, the nanostructures can comprise, e.g., monocrystalline silicon, polycrystalline silicon, amorphous silicon, or a combination thereof. For example, the nanostructures can comprise about 20-100% monocrystalline silicon, about 0-50% polycrystalline silicon, and/or about 0-50% amorphous silicon. In one class of embodiments, the nanostructures comprise 20-100% (e.g., 50-100%) monocrystalline silicon and 0-50% amorphous silicon. In one class of embodiments, the nanostructures comprise 20-100% (e.g., 50-100%) monocrystalline silicon and 0-50% polycrystalline silicon. The percentage of monocrystalline, polycrystalline, and/or amorphous silicon can be measured for the resulting nanostructures as a group or individually. Individual silicon nanostructures (e.g., nanowires) can be a combination of crystalline, polycrystalline and amorphous material as detected by transmission electron microscopy (TEM). For example, nanowires can be completely monocrystalline, can have a monocrystalline core and a polycrystalline shell, can have a monocrystalline core and an amorphous or microcrystalline shell (where the grain structure is not visible within the resolution of TEM), or can have a monocrystalline core and a shell that transitions from polycrystalline to amorphous (from the core to the outside of the nanostructure). Thus, in one class of embodiments, the nanostructures comprise a monocrystalline core and a shell layer, wherein the shell layer comprises amorphous silicon, polycrystalline silicon, or a combination thereof.

The nanostructures optionally include a coating. For example, silicon nanostructures optionally bear a silicon oxide coating. As described in U.S. patent application publication no. 2010/0297502 by Zhu et al. entitled "Nanostructured materials for battery applications," a carbon coating can be applied to the silicon nanostructures, e.g., where the nanostructures are intended for incorporation into a battery anode. The nanostructures optionally have a polymer coating. See also, e.g., U.S. Pat. No. 7,842,432 to Niu et al. entitled "Nanowire structures comprising carbon" and U.S. patent application publication no. 2011/0008707 by Muraoka et al. entitled "Catalyst layer for fuel cell membrane electrode assembly, fuel cell membrane electrode assembly using the catalyst layer, fuel cell, and method for producing the catalyst layer."

In one aspect, the nanostructures are silicon nanowires. Nanowires produced by the methods can be of essentially any desired size. For example, the nanowires can have a diameter of about 10 nm to about 500 nm, or about 20 nm to about 400 nm, about 20 nm to about 300 nm, about 20 nm to about 200 nm, about 20 nm to about 100 nm, about 30 nm to about 100 nm, or about 40 nm to about 100 nm. Typically, the nanowires have an average diameter less than about 150 nm, e.g., between about 10 nm and about 100 nm, e.g., between about 30 nm and about 50 nm, e.g., between about 40 nm and about 45 nm. The nanowires are optionally less than about 100 μm in length, e.g., less than about 10 μm, about 100 nm to about 100 μm, or about 1 μm to about 75 μm, about 1 μm to about 50 μm, or about 1 μm to about 20 μm in length. The aspect ratios of the nanowires are optionally up to about 2000:1 or about 1000:1. For example, the nanowires can have a diameter of about 20 nm to about 200 nm and a length of about 0.1 μm to about 50 μm.

The nanostructures can be synthesized using essentially any convenient technique. As one example, a vapor-liquid-solid (VLS) technique such as that described above for gold catalyst particles can be employed with the copper-based catalyst. VLS techniques employing copper catalysts typically require high temperatures, however (e.g., above 800° C. for silicon nanowires). Vapor-solid-solid (VSS) techniques in which the copper-based catalyst remains in the solid phase are typically more convenient since they can be performed at lower temperatures (e.g., about 500° C. for silicon nanowires). VSS and VLS techniques are known in the art: see, e.g., U.S. patent application publication no. 2011/0039690 by Niu et al. entitled "Porous substrates, articles, systems and compositions comprising nanofibers and methods of their use and production," U.S. Pat. No. 7,825,036 to Yao et al. entitled "Method of synthesizing silicon wires," Renard et al. (2010) "Catalyst preparation for CMOS-compatible silicon nanowire synthesis" Nature Nanotech 4:654-657, U.S. Pat. No. 7,776,760 to Taylor entitled "Systems and methods for nanowire growth," U.S. Pat. No. 7,301,199 to Lieber et al. entitled "Nanoscale wires and related devices," U.S. Pat. No. 7,211,464 to Lieber et al. entitled "Doped elongated semiconductors, growing such semiconductors, devices including such semiconductors and fabricating such devices," Cui et al. (2001) "Diameter-controlled synthesis of single-crystal silicon nanowires" Appl. Phys. Lett. 78, 2214-2216, Morales et al. (1998) "A laser ablation method for the synthesis of crystalline semiconductor nanowires" Science 279, 208-211, and Qian et al. (2010) "Synthesis of germanium/multi-walled carbon nanotube core-sheath structures via chemical vapor deposition" in N. Lupu (Ed.), Nanowires Science and Technology (pp. 113-130) Croatia, INTECH. See also Example 1 hereinbelow. For synthesis of silicon nanostructures (e.g., silicon nanowires), the crystallinity of the resulting nanostructures can be controlled, e.g., by controlling the growth temperature, precursors, and/or other reaction conditions that are employed. A chlorinated silane precursor or an etchant gas such as HCl can be employed to prevent undesired deposition of silicon at locations other than the catalyst (e.g., exposed substrate surfaces or the sidewall of the reaction chamber) and/or tapering of the nanowires due to dripping of molten catalyst down the growing nanowire leading to growth on the sidewall of the nanowire (which can also result in formation of an amorphous or polycrystalline shell on the nanowire): see, e.g., U.S. Pat. Nos. 7,776,760 and 7,951,422. These problems are greatly reduced by use of a solid copper-based catalyst instead of a liquid gold catalyst, so use of a copper-based catalyst can reduce or eliminate need for inclusion of an etchant (or use of a chlorinated silane precursor) in the nanostructure synthesis process.

Additional information on nanostructure synthesis using various techniques is readily available in the art. See, e.g., U.S. Pat. No. 7,105,428 to Pan et al. entitled "Systems and methods for nanowire growth and harvesting." U.S. Pat. No. 7,067,867 to Duan et al. entitled "Large-area nonenabled macroelectronic substrates and uses therefor," U.S. Pat. No. 7,951,422 to Pan et al. entitled "Methods for oriented growth of nanowires on patterned substrates," U.S. Pat. No. 7,569,941 to Majumdar et al. entitled "Methods of fabricating nanostructures and nanowires and devices fabricated therefrom," U.S. Pat. No. 6,962,823 to Empedocles et al. entitled "Methods of making, positioning and orienting nanostructures, nanostructure arrays and nanostructure devices," U.S. patent application Ser. No. 12/824,485 by Dubrow et al. entitled "Apparatus and methods for high density nanowire growth," Gudiksen et al (2000) "Diameter-selective synthesis of semiconductor nanowires" J. Am. Chem. Soc. 122, 8801-8802; Gudiksen et al. (2001) "Synthetic control of the diameter and length of single crystal semiconductor nanowires" J. Phys. Chem. B 105, 4062-4064; Duan et al. (2000) "General synthesis of compound semiconductor nanowires" Adv. Mater. 12, 298-302; Cui et al. (2000) "Doping and electrical transport in silicon nanowires" J. Phys. Chem. B 104, 5213-5216; Peng et al. (2000) "Shape control of CdSe nanocrystals" Nature 404, 59-61; Puntes et al. (2001) "Colloidal nanocrystal shape and size control: The case of cobalt" Science 291, 2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 6,036,774 to Lieber et al. (Mar. 14, 2000) entitled "Method of producing metal oxide nanorods"; U.S. Pat. No. 5,897,945 to Lieber et al. (Apr. 27, 1999) entitled "Metal oxide nanorods"; U.S. Pat. No. 5,997,832 to Lieber et al. (Dec. 7, 1999) "Preparation of carbide nanorods"; Urbau et al. (2002) "Synthesis of single-crystalline perovskite nanowires composed of barium titanate and strontium titanate" J. Am. Chem. Soc., 124, 1186; and Yun et al. (2002) "Ferroelectric Properties of Individual Barium Titanate Nanowires Investigated by Scanned Probe Microscopy" Nanoletters 2, 447.

Synthesis of core-shell nanostructure heterostructures, namely nanocrystal and nanowire core-shell heterostructures, are described in, e.g., Peng et al. (1997) "Epitaxial growth of highly luminescent CdSe/CdS core/shell nanocrystals with photostability and electronic accessibility" J. Am. Chem. Soc. 119, 7019-7029; Dabbousi et al. (1997) "(CdSe)ZnS core-shell quantum dots: Synthesis and characterization of a size series of highly luminescent nanocrystallites" J. Phys. Chem. B 101, 9463-9475; Manna et al. (2002) "Epitaxial growth and photochemical annealing of graded CdS/ZnS shells on colloidal CdSe nanorods" J. Am. Chem. Soc. 124, 7136-7145; and Cao et al. (2000) "Growth and properties of semiconductor core/shell nanocrystals with InAs cores" J. Am. Chem. Soc. 122, 9692-9702. Similar approaches can be applied to growth of other core-shell nanostructures. Growth of nanowire heterostructures in which the different materials are distributed at different locations along the long axis of the nanowire is described in, e.g., Gudiksen et al. (2002) "Growth of nanowire superlattice structures for nanoscale photonics and electronics" Nature 415, 617-620; Bjork et al. (2002) "One-dimensional steeplechase for electrons realized" Nano Letters 2, 86-90; Wu et al. (2002) "Block-by-block growth of single-crystalline Si/SiGe superlattice nanowires" Nano Letters 2, 83-86; and US patent application publication no. 2004/0026684 to Empedocles entitled "Nanowire heterostructures for encoding information." Similar approaches can be applied to growth of other heterostructures.

In embodiments in which the substrate comprises a population of particles (e.g., graphite or silica particles), the substrate particles with catalyst particles disposed thereon are typically loaded into a reaction vessel in which nanostructure synthesis is subsequently performed. For example, the substrate particles can be loaded into a quartz tube or cup with a porous frit (e.g., a quartz frit) to retain the particles, e.g., as gas flows through the vessel during a CVD (e.g., VLS or VSS) nanostructure synthesis reaction.

The substrate particles can form a packed bed in the reaction vessel. Without limitation to any particular mechanism, conversion of reactant (e.g., a source or precursor gas) depends on the relative reaction and gas flow rates. Minimal variation in reactant concentration throughout the bed can be achieved, or high total conversion can be achieved. In the case of high total conversion, the amount of nanostructures grown on the substrate particles typically varies from the entrance to the exit of the packed bed due to depletion of the source gas. This effect can be mitigated, if desired, e.g., by flowing the reactant gas in both directions through the vessel or by mixing the substrate particles during the growth process.

Where mixing of the substrate particles is desired, the reaction vessel can contain a mechanical stirrer or mixer that acts to redistribute the substrate particles in the vessel over the course of the nanostructure synthesis reaction. Convection of particles within the bed can allow each particle to experience similar growth conditions (e.g., temperature and reactant concentration) on average, particularly when recirculation of particles within the bed is faster than the growth rate of the nanostructures. For example, the reaction vessel can include a helical ribbon or a rotating impeller blade, e.g., in a vertical or horizontal reaction vessel. As another example, the reaction vessel can be horizontal and made to rotate: rotation of the vessel drags the substrate particles up the vessel walls, resulting in mixing. A component of the vessel is optionally fixed (i.e., not rotating), for example, a tube in the center of the vessel for injection of gases. Other components are optionally fixed to the static component, for example, a scraper to prevent sticking of material to the vessel walls (e.g., a thin band or wire comformal to the vessel walls) or an array of rigid pins. The reaction vessel can include two linear arrays of regularly spaced rigid pins, one fixed to the rotating wall and the other to the static inlet tube, with the pins normal to the tube walls. The moving and fixed arrays of pins are offset in an interdigitated fashion, so that they do not collide but instead push any aggregates of substrate particles between the pins, breaking up and limiting aggregate size. As additional examples, the substrate particles can be fluidized by ultrasonic or mechanical shaking of the bed instead of or in addition to by mechanical stirring.

It is worth noting that bed volume typically increases with increasing gas flow rate. It is also worth noting that at very low pressure, for example, less than about 500 mtorr, fluidization of substrate particles is impeded. Growth pressure ranges above about 500 mtorr (e.g., medium-low vacuum, above 200 to 400 torr, to near-atmospheric, atmospheric, or above-atmospheric pressure) are therefore generally preferred for nanostructure growth in a mixed bed.

The methods can be employed for production of nanostructures for use in any of a variety of different applications. For example, as noted above, the nanostructures and optionally the substrate on which the nanostructures were grown can be incorporated into a battery, battery anode, and/or battery slurry. In one class of embodiments, the nanostructures and substrate are incorporated into the anode electrode of a lithium ion battery.

A lithium ion battery typically includes an anode, an electrolyte (e.g., an electrolyte solution), and a cathode. A separator (e.g., a polymer membrane) is typically placed between the anode and the cathode in embodiments in which the electrolyte is, e.g., a liquid or gel. In embodiments where a solid-state electrolyte is employed, a separator is typically not included. The anode, electrolyte, cathode, and separator (if present) are encased in a housing.

Suitable materials for the housing, cathode, electrolyte, and separator are known in the art. See, e.g., U.S. patent application publication no. 2010/0297502. For example, the housing can be a metal, polymer, ceramic, composite, or like material, or can include a combination of such materials (e.g., a laminate of metallic and polymer layers). The cathode can comprise any suitable material known for use as a battery cathode, including, but not limited to, lithium-containing materials such as $LiCoO_2$, $LiFePO_4$, $LiMnO_2$, $LiMnO_4$, $LiNiCoAlO/LiNiCoMnO^+LiMn_2O_4$, $LiCoFePO_4$ and $LiNiO_2$. The electrolyte can comprise a solid-state electrolyte (e.g., an alkali metal salt, e.g., a lithium salt, mixed with an ionically conducting material) or an electrolyte solution (e.g., an alkali metal salt, e.g., a lithium salt, e.g., $LiPF_6$, dissolved in a solvent, e.g. an organic solvent, e.g., diethyl carbonate, ethylene carbonate, ethyl methyl carbonate, or a combination thereof). The separator can be a microporous polymer material having good ionic conductivity and sufficiently low electronic conductivity, e.g., PVDF, polypyrrole, polythiaphene, polyethylene oxide, polyacrylonitrile, poly(ethylene succinate), polypropylene, poly (β-propiolactone), or a sulfonated fluoropolymer such as NAFION®.

In one class of embodiments, after nanostructure synthesis, the nanostructures and the substrate are incorporated into a battery slurry, e.g., by mixing the substrate bearing the nanostructures with a polymer binder and a solvent (e.g., water or an organic solvent). Suitable binders (e.g., conductive polymers) and solvents are known in the art. Examples include, but are not limited to, polyvinylidene difluoride (PVDF) as the binder with N-methyl-2-pyrrolidone (NMP) as the solvent or carboxymethyl cellulose (CMC) as the binder with water as the solvent. The battery slurry (which can also be referred to as an active material slurry) is coated on a current collector, e.g., copper foil. Evaporation of the solvent leaves the active materials (the nanostructures and the substrate) and the polymer binder coating the current collector. This assembly can then be employed as a battery anode, e.g., after insertion into a suitable housing along with a cathode, electrolyte, and optionally a separator placed in the electrolyte between the anode and cathode.

In one class of embodiments, the substrate comprises a population of graphite particles and the nanostructures comprise silicon nanowires. Optionally, for example, in embodiments in which the nanowires and graphite particles are to be incorporated into a battery, slurry, or anode, when nanostructure growth is finished, silicon comprises between 1% and 50% of the total weight of the nanostructures and the graphite particles, e.g., between 1% and 40%, between 1% and 30%, or between 2% and 25%. Optionally, silicon comprises between 2% and 20% of the total weight of the nanostructures and the graphite particles, or between 6% and 20% of the total weight of the nanostructures and the graphite particles. Where the nanowires and graphite are used in a battery, it will be evident that increasing the silicon content tends to increase the capacity per gram and that the silicon content is desirably matched with the specific capacity of the cathode.

Battery Active Materials Synthesized Using Copper-Based Catalysts

Compositions produced by or useful in practicing any of the methods herein are also a feature of the invention. For example, nanostructures grown from copper-based catalysts on porous substrates are a feature of the invention.

Accordingly, one general class of embodiments provides a composition that includes a porous substrate and a population of nanostructures attached thereto. A region of each of the nanostructures is attached to the substrate, and another region of each nanostructure (generally distal to the first region) comprises copper, a copper compound, and/or a copper alloy, equivalent to or derived from the catalyst that was employed in the synthesis reaction. Attachment of the nanostructures to the substrate on which they were grown is typically through van der Waals interactions.

Thus, in one class of embodiments, the composition includes a porous substrate and a population of silicon nanowires attached thereto, wherein one end of a member nanowire is attached to the substrate and the other end of the member nanowire comprises copper, a copper compound, and/or a copper alloy.

Essentially all of the features noted for the embodiments above apply to these embodiments as well, as relevant: for example, with respect to type, composition, and size of nanostructures, composition and configuration of the substrate, catalyst material, incorporation into a battery slurry, battery anode, or battery, and/or the like.

For example, the composition can include nanowires having an average diameter of about 10 nm to about 500 nm, or about 20 nm to about 400 nm, about 20 nm to about 300 nm, about 20 nm to about 200 nm, about 20 nm to about 100 nm, about 30 nm to about 100 nm, or about 40 nm to about 100 nm. Typically, the nanowires have an average diameter less than about 150 nm, e.g., between about 10 nm and about 100 nm, e.g., between about 30 nm and about 50 nm, e.g., between about 40 nm and about 45 nm. The nanowires are optionally less than about 100 μm in length, e.g., less than about 10 μm, about 100 nm to about 100 μm, or about 1 μm to about 75 μm, about 1 μm to about 50 μm, or about 1 μm to about 20 μm in length. The aspect ratios of the nanowires are optionally up to about 2000:1 or about 1000:1. For example, the nanowires can have a diameter of about 20 nm to about 200 nm and a length of about 0.1 μm to about 50 μm. The nanowires can comprise monocrystalline silicon, polycrystalline silicon, amorphous silicon, or a combination thereof, e.g., in the relative amounts detailed above. For example, the nanowires optionally comprise a monocrystalline core and a shell layer, wherein the shell layer comprises amorphous silicon, polycrystalline silicon, or a combination thereof.

As for the embodiments above, the porous substrate is optionally a mesh, fabric, e.g., a woven fabric (e.g., a carbon fabric), or fibrous mat. In preferred embodiments, the substrate comprises a population of particles, sheets, fibers (including, e.g., nanofibers), and/or the like. Thus, exemplary substrates include a plurality of silica particles (e.g., a silica powder), a plurality of carbon sheets, carbon powder or a plurality of carbon particles, natural and/or artificial (synthetic) graphite, natural and/or artificial (synthetic) graphite particles, graphene, graphene powder or a plurality of graphene particles, carbon fibers, carbon nanostructures, carbon nanotubes, and carbon black. Where the nanostructures, e.g., silicon nanowires, are intended for use as a battery active material, the substrate is typically a carbon-based substrate, for example, a population of graphite particles.

In embodiments in which the substrate comprises a population of particles (e.g., graphite particles), the particles can be of essentially any desired shape, for example, spherical or substantially spherical, elongated, oval/oblong, plate-like (e.g., plates, flakes, or sheets), and/or the like. Similarly, the substrate particles can be of essentially any size. Optionally, the substrate particles have an average diameter between about 0.5 µm and about 50 µm, e.g., between about 0.5 µm and about 2 µm, between about 2 µm and about 10 µm, between about 2 µm and about 5 µm, between about 5 µm and about 50 µm, between about 10 µm and about 30 µm, between about 10 µm and about 20 µm, between about 15 µm and about 25 µm, between about 15 µm and about 20 µm, or about 20 µm. In one exemplary class of embodiments, the nanostructures are silicon nanowires, the substrate is a population of graphite particles, and the graphite particle size is about 10-20 µm. In another exemplary class of embodiments, the nanostructures are silicon nanowires, the substrate is a population of graphite particles, the graphite particle size is a few µm (e.g., about 2 µm or less), and the graphite particles are optionally spherical.

The catalyst-derived material on the distal region of the nanostructures, e.g., the ends of the member nanowires not attached to the substrate, can comprise, e.g., elemental copper, copper oxide, copper silicide, or a combination thereof.

The composition optionally includes a polymer binder (for example, any of those noted above) and/or a solvent (e.g., water or an organic solvent as noted above). In one class of embodiments, for example, where the composition is included in a battery, slurry, or anode, the substrate comprises a population of graphite particles, the nanostructures are silicon nanostructures, and silicon comprises between 1% and 50% of the total weight of the nanostructures and the graphite particles, e.g., between 1% and 40%, between 1% and 30%, or between 2% and 25%. Optionally, silicon comprises between 2% and 20% of the total weight of the nanostructures and the graphite particles, or between 6% and 20% of the total weight of the nanostructures and the graphite particles.

A battery slurry comprising a composition of the invention is also a feature of the invention. Thus, one class of embodiments provides a battery slurry comprising a porous substrate, a population of silicon nanowires, a polymer binder, and a solvent, where one end of a member nanowire is attached to the substrate and the other end of the member nanowire comprises copper, a copper compound, and/or a copper alloy. Similarly, a battery anode comprising a composition of the invention is also a feature of the invention, as is a battery comprising a composition of the invention. Thus, one class of embodiments provides a battery (e.g., a lithium ion battery) that includes an anode comprising a porous substrate and a population of silicon nanowires attached thereto, wherein one end of a member nanowire is attached to the substrate and the other end of the member nanowire comprises copper, a copper compound, and/or a copper alloy. A polymer binder is typically also included in the anode, and the battery typically also includes a cathode, an electrolyte, and an optional separator, encased in a housing. Suitable binders, cathode materials, electrolytes, housing materials, and the like have been noted hereinabove.

Colloidal Synthesis of Copper-Based Nanoparticles

Copper-containing nanoparticles are of interest in a wide variety of applications. For example, cuprous oxide ($Cu_2O$) is a p-type semiconductor with potential applications in solar energy conversion, catalysis (e.g., CO oxidation and photo-activated water splitting into $H_2$ and $O_2$), and gas sensing and as an anode material for lithium ion batteries. As noted above, cuprous oxide and other copper-based nanoparticles are also of interest as catalysts for nanostructure synthesis.

Nanoparticles containing copper, copper alloy, and/or a copper compound can be conveniently prepared using colloidal synthesis techniques. As used herein, synthesis of colloidal nanoparticles refers to production of a colloid mixture that includes a solvent and nanoparticles, where the particles are dispersed evenly throughout the solvent. "Colloidal nanoparticles" refers to nanoparticles produced via colloidal synthesis, even if the nanoparticles are subsequently removed from the solvent, for example, by deposition on a solid substrate.

Figure 1A:
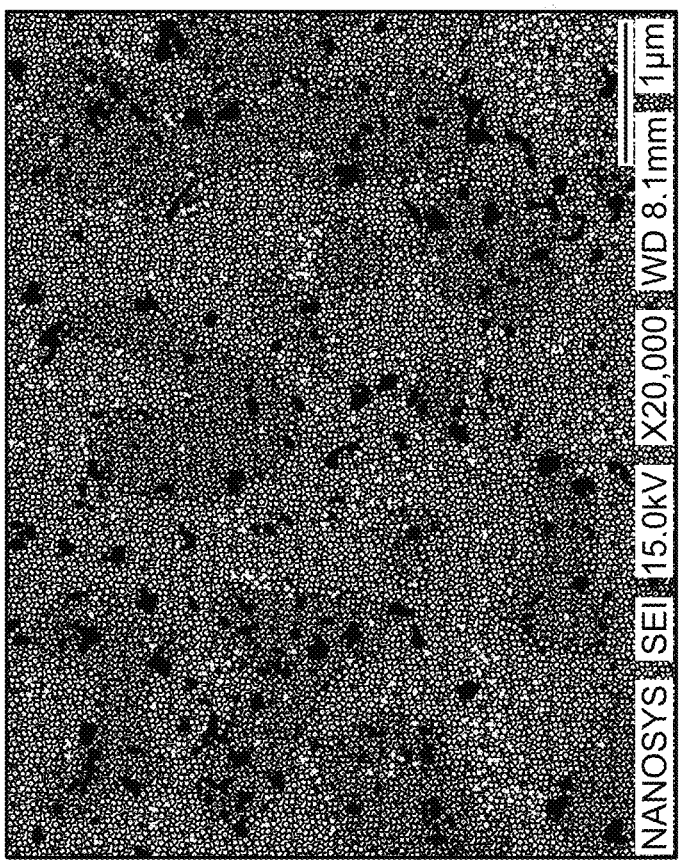

$Cu_2O$ nanoparticles can be synthesized from a modified Fehling's solution, where $Cu^{2+}$, protected by a capping agent, is reduced to $Cu_2O$ in an alkaline aqueous solution. Nanoparticles that precipitate out of the solution when synthesized via this route can be resuspended to form a colloid if appropriate ligands are attached to the nanoparticles. For example, $Cu_2O$ nanoparticles can be synthesized as a stable $Cu_2O$ colloid in water (i.e., a hydrosol), using sodium ascorbate or ascorbic acid to reduce a copper (II) salt to $Cu_2O$ in the presence of surfactant. Controlling conditions such as pH and concentrations results in formation of colloidal $Cu_2O$ (stable for at least several hours), with a narrow particle size distribution and average particle size varying, e.g., from 15 to 100 nm as determined by electron microscopy and/or light scattering. In particular, colloidal $Cu_2O$, which is stable for a few hours, has been synthesized from the reduction of copper (II) sulfate using sodium ascorbate or ascorbic acid in the presence of sodium dodecyl sulfate (an anionic surfactant), Triton X-100 (a nonionic surfactant), or cetrimonium chloride (a cationic surfactant). FIG. 1 Panels A and B show colloidal $Cu_2O$ nanoparticles synthesized in this manner; the average size was 33 nm as measured for 50 particles by electron microscopy, while results from dynamic light scattering measurements show a strong peak around 50 nm. (In general, particle size as measured by light scattering tends to be greater than that measured by electron microscopy, since light scattering measures the hydrodynamic diameter which depends on ionic strength of the suspension and surface structure of the adsorbed surfactant layer.) If the solution pH is too high, the $Cu_2O$ particles tend to grow excessively, resulting in precipitates. On the other hand, if the pH is too low, small $Cu_2O$ particles tend to dissolve in water and the colloid becomes unstable. When both pH and concentrations are appropriate and the $Cu_2O$ surfaces are protected by suitable functional groups, a stable $Cu_2O$ hydrosol exists, with a unique color ranging from light green to golden yellow. For example, colloidal $Cu_2O$, which is stable for at least one hour, may be obtained in a pH range of 8-11, with up to 5 millimolar copper ions.

As will be evident, various combinations of copper salt, reducing agent, capping agent, and surfactant can be employed. Exemplary reducing agents include, but are not limited to, glucose, formaldehyde, ascorbic acid, and phosphorous acid. Exemplary capping agents include, but are not limited to, tartaric acid and sodium citrate. Suitable surfactants/dispersants include, but are not limited to, nonionic surfactants (e.g., Triton X-100), cationic surfactants (e.g., cetrimonium chloride or cetrimonium bromide (CTAB)), anionic surfactants (e.g., sodium dodecyl sulfate (SDS)), and polymers such as polyethylene glycol (e.g., molecular weight 600-8000) and polyvinylpyrrolidone (e.g., molecular weight 55,000).

Copper-containing nanoparticles, including $Cu_2O$ nanoparticles, can also be synthesized in non-aqueous solutions. See, e.g., Yin et al. (2005) "Copper oxide nanocrystals" J Am Chem Soc 127:9506-9511 and Hung et al. (2010) "Room-temperature formation of hollow $Cu_2O$ nanoparticles" Adv Mater 22:1910-1914.

Additional information on colloidal synthesis of nanoparticles is available in the art. See, e.g., Kuo et al. (2007) "Seed-mediated synthesis of monodispersed $Cu_2O$ nanocubes with five different size ranges from 40 to 420 nm" Adv. Funct. Mater. 17:3773-3780 and Kooti and Matouri (2010) "Fabrication of nanosized cuprous oxide using Fehling's solution" Transaction F: Nanotechnology 17(1): 73-78 for synthesis of $Cu_2O$ and Yu et al. (2009) "Synthesis and characterization of monodispersed copper colloids in polar solvents" Nanoscale Res Lett. 4:465-470 for synthesis of elemental copper colloids.

Figure 2B:
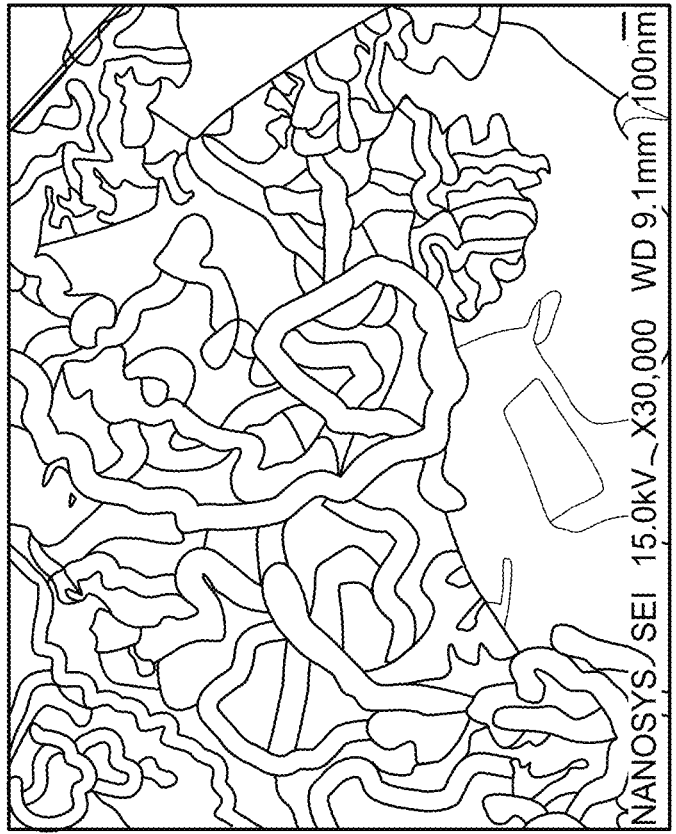
FIG. 2 Panel A shows a scanning electron micrograph of colloidal $Cu_2O$ nanoparticles deposited on a particulate graphite substrate. Panel B shows a scanning electron micrograph of silicon nanowires grown from the $Cu_2O$ nanoparticles on graphite particles.
Figure 2A:
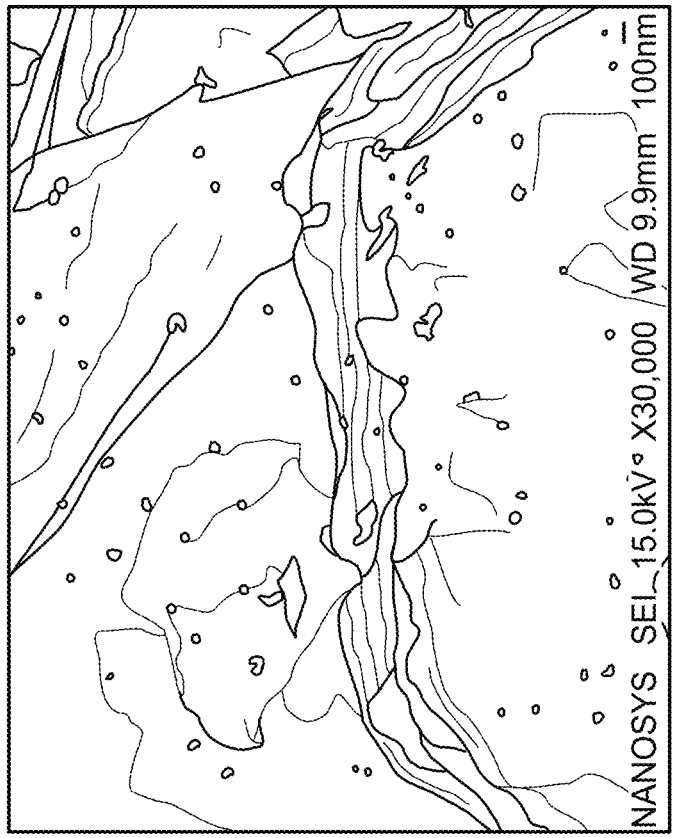

The colloidal nanoparticles are optionally employed as catalyst particles for nanostructure synthesis. See, for example, FIG. 2 Panels A and B, which show colloidal $Cu_2O$ nanoparticles deposited on a graphite particle substrate and silicon nanowires grown from the $Cu_2O$ nanoparticles. The resulting nanowires are similar to nanowires conventionally grown using gold catalyst particles.

Thus, one general class of embodiments provides methods for synthesizing nanostructures. In the methods, colloidal nanoparticles comprising copper and/or a copper compound are synthesized and deposited on a substrate, and nanostructures are grown from the nanoparticles. Exemplary nanostructures and materials are noted hereinabove and include, but are not limited to, silicon nanowires.

Accordingly, in one class of embodiments, colloidal nanoparticles comprising copper and/or a copper compound are synthesized. After their synthesis, the nanoparticles are deposited on a substrate. Nanowires are then grown from the nanoparticles.

Suitable substrates include a planar substrate, silicon wafer, or foil (e.g., a metal foil, e.g., stainless steel foil). Suitable substrates include nonporous substrates as well as porous substrates such as those described above, e.g., a mesh, fabric, e.g., a woven fabric (e.g., a carbon fabric), fibrous mat, population of particles, sheets, fibers (including, e.g., nanofibers), and/or the like. Thus, exemplary substrates include a plurality of silica particles (e.g., a silica powder), a plurality of carbon sheets, carbon powder or a plurality of carbon particles, natural and/or artificial (synthetic) graphite, natural and/or artificial (synthetic) graphite particles, graphene, graphene powder or a plurality of graphene particles, carbon fibers, carbon nanostructures, carbon nanotubes, and carbon black. Where the nanostructures, e.g., silicon nanowires, are intended for use as a battery active material, the substrate is typically a carbon-based substrate, for example, a population of graphite particles.

In embodiments in which the substrate comprises a population of particles (e.g., graphite particles), the particles can be of essentially any desired shape, for example, spherical or substantially spherical, elongated, oval/oblong, plate-like (e.g., plates, flakes, or sheets), and/or the like. Similarly, the substrate particles can be of essentially any size. Optionally, the substrate particles have an average diameter between about 0.5 µm and about 50 µm, e.g., between about 0.5 µm and about 2 µm, between about 2 µm and about 10 µm, between about 2 µm and about 5 µm, between about 5 µm and about 50 µm, between about 10 µm and about 30 µm, between about 10 µm and about 20 µm, between about 15 µm and about 25 µm, between about 15 µm and about 20 µm, or about 20 µm. In one exemplary class of embodiments, the nanostructures are silicon nanowires, the substrate is a population of graphite particles, and the graphite particle size is about 10-20 µm. In another exemplary class of embodiments, the nanostructures are silicon nanowires, the substrate is a population of graphite particles, the graphite particle size is a few µm (e.g., about 2 µm or less), and the graphite particles are optionally spherical.

The copper compound is optionally copper oxide. In one class of embodiments, the nanoparticles comprise elemental copper (Cu), copper (I) oxide ($Cu_2O$), copper (II) oxide (CuO), or a combination thereof. Optionally, the substrate comprises a population of graphite particles.

The shape and size of the nanoparticles can vary, for example, depending on the diameter desired for the resulting nanowires. For example, the nanoparticles optionally have an average diameter between about 5 nm and about 100 nm, e.g., between about 10 nm and about 100 nm, between about 20 nm and about 50 nm, or between about 20 nm and about 40 nm. Optionally, the nanoparticles have an average diameter of about 20 nm. The nanoparticles can be of essentially any shape, including, but not limited to, spherical, substantially spherical, or other regular or irregular shapes.

Essentially all of the features noted for the embodiments above apply to these embodiments as well, as relevant: for example, with respect to nanostructure growth technique (e.g., VLS or VSS), type, composition, and size of the resulting nanostructures, ratio of nanostructures to substrate (e.g., silicon to graphite) by weight, incorporation into a battery slurry, battery anode, or battery, and/or the like.

The nanoparticles can be deposited on the substrate using essentially any convenient technique, for example, spin coating, spraying, dipping, or soaking. Nanoparticles can be deposited on a particulate substrate (e.g., graphite particles) by stirring a mixture of the nanoparticles and substrate particles, e.g., in a solvent: the substrate particles with the nanoparticles deposited thereon can then be recovered by filtration and optionally dried to remove residual solvent. Preferably, the nanoparticles are deposited on the substrate surface and their phase and/or morphology is preserved before nanostructure synthesis is commenced (e.g., by introduction of silane gas into the reaction chamber). Deposition of the nanoparticles on the substrate is desirably even.

The colloid and/or the substrate can be treated or modified to enhance association of the nanoparticles with the surface of the substrate. Where the colloid is negatively charged and the substrate is positively charged (or vice versa), the nanoparticles generally stick to the surface of the substrate well. If necessary, however, the charge or other surface characteristics of either or both the colloid and the surface can be modified. For example, where elemental copper or copper oxide nanoparticles are deposited on graphite particles as the substrate, the graphite can be treated, e.g., with acid, to increase adherence of the nanoparticles to the graphite. Ligands on the nanoparticles (e.g., surfactants) and/or the substrate can be varied.

Electroless Deposition of Copper-Based Nanoparticles

Electroless plating generally involve immersion of a substrate in a solution containing a metal salt. Chemical reactions on the substrate's surface result in plating of the metal out of solution onto the surface. The reactions occur without use of external electrical power.

For example, electroless copper plating can be achieved by immersing an activated substrate in a bath containing a copper source (e.g., a copper (II) salt), a chelating agent, and a reducing agent such as formaldehyde, typically at alkaline pH. Without limitation to any particular mechanism, deposition of copper can occur through the following reactions:

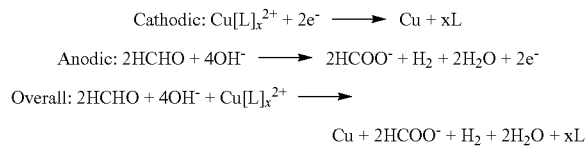

The reaction is autocatalytic only in the presence of an activated surface or when hydrogen is being generated. Deposition rate depends on, e.g., the copper complexing agent, reducing agent, pH, bath temperature, and any additives that may be included in the plating solution (e.g., stabilizer, surfactant, accelerator, etc.).

Electroless plating has been used to plate or deposit a thin layer of copper film on substrates, particularly dielectric materials such as PCB (plastic circuit board). The process is, however, not user-friendly, particularly when the substrate is in the form of fine powders which require filtration to separate the solid from the liquid effluent. To achieve the desired copper level, plating parameters (e.g., time of immersion and bath temperature) must be precisely controlled. In addition, critical ingredients in the plating bath must be analyzed and replenished to maintain the process stability. See, e.g., U.S. Pat. No. 4,136,216 to Feldstein entitled "Non-precious metal colloidal dispersions for electroless metal deposition"; U.S. Pat. No. 4,400,436 to Breininger et al. entitled "Direct electroless deposition of cuprous oxide films"; U.S. Pat. No. 4,171,225 to Molenaar et al. entitled "Electroless copper plating solutions"; Liu et al. (1999) "Modifications of synthetic graphite for secondary lithium-ion battery applications" J Power Sources 81-82: 187-191; Lu et al. (2002) "Electrochemical and thermal behavior of copper coated type MAG-20 natural graphite" Electrochimica Acta 47(10): 1601-1606; Yu (2007) "A novel processing technology of electroless copper plating on graphite powder" Materials Protection 2007-09; Bindra and White (1990) "Fundamental aspects of electroless copper plating" in Mallory and Hajdu (Eds.) Electroless Plating—Fundamentals and Applications (pp. 289-329) William Andrew Publishing/Noyes; Li and Kohl (2004) "Complex chemistry & the electroless copper plating process" Plating & Surface Finishing February 2-8; Xu et al. (2004) "Preparation of copper nanoparticles on carbon nanotubes by electroless plating method" Materials Research Bulletin 39:1499-1505; and Siperko (1991) "Scanning tunneling microscopy studies of Pd—Sn catalyzed electroless Cu deposited on pyrolytic graphite" J Vac Sci Technol A 9(3): 1457-1460. Achieving consistent and reproducible deposition of discrete nanoparticles (rather than a continuous or semi-continuous film) on the surface of the substrate is even more challenging.

In one aspect, the present invention overcomes the above noted difficulties by providing methods of producing copper-based nanoparticles on any of a variety of substrates. The amount of the copper source present in the plating solution is much lower than is typical in conventional plating processes. In addition, in contrast to conventional techniques, the copper source is completely depleted from the bath after deposition. Deposition of copper at a high copper concentration requires careful monitoring of time and reactant concentrations and replenishment of the bath components; deposition at low concentration, as described herein, provides more convenient control over the reaction.

The inventive methods have a number of advantages. For example, since a known amount of the copper source is added to the plating bath and substantially completely depleted from the bath by deposition on the substrate, the reaction stops automatically, and the amount of copper deposited on the substrate is known and precisely controlled. There is no need to critically control plating parameters such as time and bath temperature to achieve the desired percentage of copper deposited. There is no need to analyze and/or replenish depleted chemicals during the plating process, which greatly simplifies deposition on particulate substrates, whose high surface area complicates deposition with conventional techniques. Where powdered substrates are employed, the substrate and the plating chemicals can be mixed in various orders to control the deposition rate and uniformity. Since copper is substantially completely depleted after deposition, treatment of spent plating solutions prior to waste disposal is simplified.

Accordingly, one general class of embodiments provides methods for producing nanoparticles. In the methods, a substrate is provided. Also provided is an electroless plating solution that comprises at most 10 millimolar copper ions (e.g., $Cu^{2+}$ and/or $Cu^+$). The substrate is immersed in the plating solution, which is optionally heated to about 60-70° C., whereby the copper ions from the plating solution form discrete nanoparticles comprising copper and/or a copper compound on the substrate, until the plating solution is substantially completely depleted of copper ions. "Substantially completely depleted of copper ions" means that less than 5 ppm or even less than 1 ppm copper ion remains in the solution. No monitoring or analysis of the components of the plating solution is necessary during the immersion step, and no reagents need to be added to the plating solution during the immersion step.

Suitable substrates include a planar substrate, silicon wafer, or foil (e.g., a metal foil, e.g., stainless steel foil). Suitable substrates include nonporous substrates as well as porous substrates such as those described above, e.g., a mesh, fabric, e.g., a woven fabric (e.g., a carbon fabric), fibrous mat, population of particles, sheets, fibers (including, e.g., nanofibers), and/or the like. Thus, exemplary substrates include a plurality of silica particles (e.g., a silica powder), a plurality of carbon sheets, carbon powder or a plurality of carbon particles, natural and/or artificial (synthetic) graphite, natural and/or artificial (synthetic) graphite particles, graphene, graphene powder or a plurality of graphene particles, carbon fibers, carbon nanostructures, carbon nanotubes, and carbon black. The substrate is optionally a carbon-based substrate, for example, a population of graphite particles.

In embodiments in which the substrate comprises a population of particles (e.g., graphite particles), the particles can be of essentially any desired shape, for example, spherical or substantially spherical, elongated, oval/oblong, plate-like (e.g., plates, flakes, or sheets), and/or the like. Similarly, the substrate particles can be of essentially any size. Optionally, the substrate particles have an average diameter between about 0.5 μm and about 50 μm, e.g., between about 0.5 μm and about 2 μm, between about 2 μm and about 10 μm, between about 2 μm and about 5 μm, between about 5 μm and about 50 μm, between about 10 μm and about 30 μm, between about 10 μm and about 20 μm, between about 15 μm and about 25 μm, between about 15 μm and about 20 μm, or about 20 μm. In one exemplary class of embodiments, the substrate is a population of graphite particles, and the graphite particle size is about 10-20 μm. In another exemplary class of embodiments, the substrate is a population of graphite particles, the graphite particle size is a few μm (e.g., about 2 μm or less), and the graphite particles are optionally spherical.

The substrate is typically activated prior to its immersion in the plating solution. The substrate is optionally activated as known in the art by soaking it in a solution of a metal salt, e.g., by soaking in a solution of $PdCl_2$ or $AgNO_3$. Graphite substrates, however, particularly graphite particles which have a very high surface area compared to a conventional planar substrate, are conveniently activated simply by heating them prior to immersion in the plating solution. Thus, the methods optionally include activating the substrate (e.g., a population of graphite particles) by heating it to 20° C. or more prior to immersing it in the plating solution. Optionally, the substrate is activated by heating it to 30° C. or more, preferably 40° C. or more, 50° C. or more, or 60° C. or more prior to immersion.

In embodiments in which the substrate comprises a population of particles, the methods can include filtering the plating solution to recover the substrate particles from the plating solution after the plating solution is substantially completely depleted of copper ions. In general, the substrate is typically removed from the plating solution after deposition is complete (that is, after the plating solution is substantially completely depleted of copper ions).

As described above, electroless plating generally involves chemical reduction from an aqueous plating solution that includes one or more copper source, complexing or chelating agent, and reducing agent, optionally at alkaline pH. The copper source is typically a copper salt, e.g., a copper (II) salt (for example, copper sulfate, copper nitrate, copper (II) chloride ($CuCl_2$), or copper acetate) or a copper (I) salt (for example, copper (I) chloride (CuCl)). Exemplary chelating agents include, but are not limited to, Rochelle salt, EDTA, and polyols (e.g., Quadrol® (N,N,N',N'-tetrakis (2-hydroxypropyl) ethylene-diamine)). Exemplary reducing agents include, but are not limited to, formaldehyde and sodium hypophosphite ($NaH_2PO_2$). The plating solution optionally includes one or more additives such as a stabilizer, surfactant, and/or accelerator. The pH of the plating solution can be adjusted as is well known in the art, for example, by addition of sodium hydroxide (NaOH), typically to a pH of 12 to 13. The plating solution is optionally heated, e.g., to a temperature of 60-70° C.

In one exemplary class of embodiments, the plating solution comprises a copper (II) salt (e.g., less than 1 g/L anhydrous copper sulfate), Rochelle salt, and formaldehyde and has an alkaline pH. In this class of embodiments, the substrate optionally comprises a population of particles (e.g., graphite particles).

As noted, when the substrate is initially immersed in the plating solution, the plating solution comprises at most 10 millimolar copper ions. Optionally, the plating solution comprises at most 8 millimolar copper ions, at most 6 millimolar copper ions, at most 4 millimolar copper ions, or at most 2 millimolar copper ions. It will be evident that the plating solution initially comprises substantially more than 5 ppm copper ions; for example, the initial concentration of copper ions can be at least 2 millimolar, e.g., at least 4 millimolar, at least 6 millimolar, or at least 8 millimolar.

As noted, the resulting nanoparticles can include copper or a copper compound (for example, copper oxide). In one class of embodiments, the nanoparticles comprise elemental copper (Cu), copper (I) oxide ($Cu_2O$), copper (II) oxide (CuO), or a combination thereof. Since copper oxidizes readily into copper oxide in air, where copper nanoparticles are deposited the nanoparticles can also contain at least some copper oxide unless protected from oxidation after the deposition.

The resulting nanoparticles optionally have an average diameter between about 5 nm and about 100 nm, e.g., between about 10 nm and about 100 nm, between about 20 nm and about 50 nm, or between about 20 nm and about 40 nm. Optionally, the nanoparticles have an average diameter of about 20 nm. The nanoparticles can be of essentially any shape, but are typically irregularly shaped.

Figure 3A:
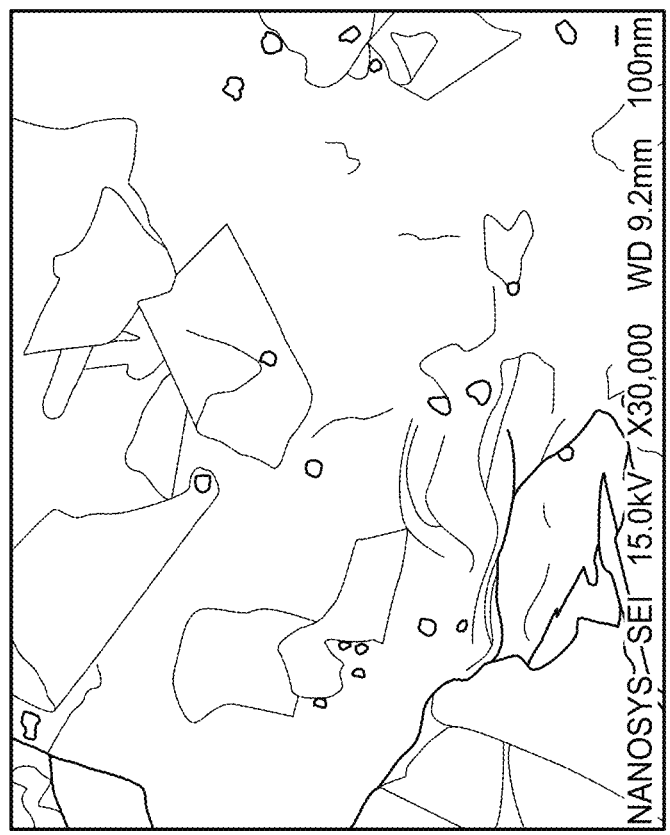
FIG. 3 Panel A shows a scanning electron micrograph of copper nanoparticles deposited on a particulate graphite substrate from an electroless plating solution. Panel B shows a scanning electron micrograph of silicon nanowires grown from the copper nanoparticles.
Figure 3B:
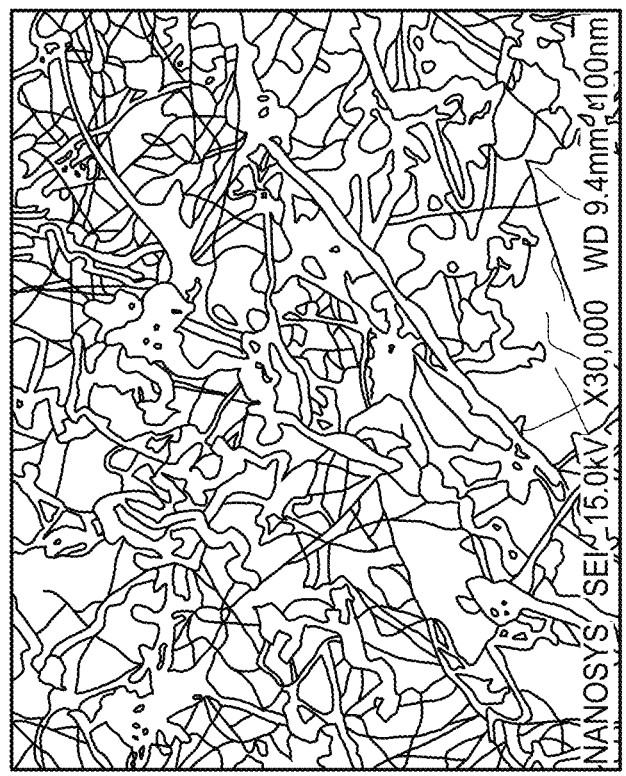

The resulting nanoparticles are optionally employed as catalyst particles for subsequent synthesis of other nanostructures, e.g., nanowires. Thus, the methods can include, after the plating solution is substantially completely depleted of copper ions, removing the substrate from the plating solution and then growing nanostructures (e.g., nanowires, e.g., silicon nanowires) from the nanoparticles on the substrate. See, for example, FIG. 3 Panels A and B, which show copper nanoparticles deposited on a graphite particle substrate from an electroless plating solution and silicon nanowires grown from the copper nanoparticles.

Essentially all of the features noted for the embodiments above apply to these embodiments as well, as relevant: for example, with respect to nanostructure growth technique (e.g., VLS or VSS), type, composition, and size of the resulting nanostructures, ratio of nanostructures to substrate (e.g., silicon to graphite) by weight, incorporation into a battery slurry, battery anode, or battery, and/or the like.

The plating solution can be employed as a single use bath or as a reusable bath. Thus, in one class of embodiments, after the solution is prepared, the substrate is immersed in the solution until the plating solution is substantially completely depleted of copper ions, and the solution is then disposed of (after any necessary treatment to render it safe for disposal) rather than being replenished and reused for a second substrate. In other embodiments, however, the bath is reused.

Thus, in one class of embodiments, after the plating solution is substantially completely depleted of copper ions, the substrate is removed from the plating solution, then copper ions are added to the plating solution, and then a second substrate is immersed in the plating solution. Typically, the same type and amount of copper source are added to replenish the reagents that were used to prepare the solution initially. Thus, as one example, adding copper ions to the plating solution can comprise adding a copper (II) salt to the plating solution; additional exemplary copper sources are listed hereinabove. Typically, after addition of the copper ions, the plating solution again comprises at most 10 millimolar copper ions. The second substrate is typically but need not be of the same type as the first substrate, e.g., a second population of particles, e.g., graphite particles.

Where the plating solution is to be reused a large number of times, the concentration of reducing agent and/or chelating agent and the pH can be analyzed and adjusted if necessary. Where only a short bath life is needed, however, or where the plating solution is used only once, there is no need to analyze the solution and replenish depleted reagents (other than the copper source, if the solution is used more than once). The shorter bath life results in ease of operation.

Since the copper source is nearly completely depleted after deposition, disposal of used plating solution is simplified compared to conventional techniques in which a large amount of copper remains in the used solution. Waste neutralization can be performed in situ. For example, in embodiments in which the plating solution comprises formaldehyde, after the plating solution is substantially completely depleted of copper ions the formaldehyde can be treated by addition of sodium sulfite to the plating solution prior to disposing of the solution. The treatment with sodium sulfite can be performed before or after removal of the substrate from the plating solution, e.g., before or after filtration to recover a particulate substrate. The waste can then be safely disposed of after pH neutralization.

Additional information on treatment of plating solutions prior to disposal is available in the art. See, e.g., Capaccio (1990) "Wastewater treatment for electroless plating" in Mallory and Hajdu (Eds.) Electroless Plating—Fundamentals and Applications (pp. 519-528) William Andrew Publishing/Noyes.

As noted above, nanoparticles produced by electroless deposition can be employed as catalyst particles in subsequent nanostructure synthesis reactions. Accordingly, one general class of embodiments provides methods for producing nanostructures (e.g., nanowires). In the methods, a substrate is provided. An electroless plating solution comprising copper ions is also provided, and the substrate is immersed in the plating solution, which is optionally heated to about 60-70° C., whereby the copper ions from the plating solution form discrete nanoparticles comprising copper and/or a copper compound on the substrate. Nanostructures (e.g., nanowires, e.g., silicon nanowires) are then grown from the nanoparticles on the substrate. Typically the substrate is removed from the plating solution prior to growth of the nanostructures.

As detailed above, limiting the concentration of copper ions in the plating solution can be advantageous, particularly for deposition on porous and/or particulate substrates having high surface areas. Thus, optionally the plating solution comprises at most 10 millimolar copper ions (e.g., $Cu^{2+}$ and/or $Cu^+$). Essentially all of the features noted for the embodiments above apply to these embodiments as well, as relevant: for example, with respect to type and composition of substrate (nonporous, porous, particles, graphite particles, sheets, wafers, etc.), activation of the substrate, size, shape, and composition of the nanoparticles (e.g., elemental copper and/or copper oxide), components of the plating solution (copper source and reducing, chelating, and other reagents), filtration step to recover a particulate substrate, reuse versus single use of the plating solution, nanostructure growth technique (e.g., VLS or VSS), type, composition, and size of the resulting nanostructures, ratio of nanostructures to substrate (e.g., silicon to graphite) by weight, incorporation into a battery slurry, battery anode, or battery, and/or the like.

Analogous methods to those detailed for copper apply to electroless deposition of nickel nanoparticles. Such methods are also a feature of the invention. Accordingly, one general class of embodiments provides methods for producing nanoparticles. In the methods, a substrate is provided. Also provided is an electroless plating solution that comprises at most 10 millimolar nickel ions. The substrate is immersed in the plating solution, whereby the nickel ions from the plating solution form discrete nanoparticles comprising nickel and/or a nickel compound on the substrate, until the plating solution is substantially completely depleted of nickel ions. Essentially all of the features noted for the embodiments above apply to these embodiments as well, as relevant.

Formation of Copper-Based Nanoparticles Through Adsorption

Nanoparticles can be conveniently formed by adsorption of copper ions or a copper complex onto the surface of a substrate. Adsorption is generally defined as the process through which a substance initially present in one phase (e.g., a liquid) is removed from that phase by accumulation at the interface between that phase and a separate phase (e.g., a solid). Adsorption is a physical separation process in which the adsorbed material is not chemically altered. Nanoparticles produced via adsorption can be employed as catalysts for subsequent nanostructure growth.

Accordingly, one general class of embodiments provides methods for producing nanostructures (e.g., nanowires). In the methods, a substrate is provided. A solution comprising copper ions and/or a copper complex is also provided, and the substrate is immersed in the solution, whereby the copper ions and/or the copper complex are adsorbed on the surface of the substrate, thereby forming discrete nanoparticles comprising a copper compound on the surface of the substrate. Nanostructures (e.g., nanowires, e.g., silicon nanowires) are then grown from the nanoparticles on the substrate. Typically the substrate is removed from the solution prior to growth of the nanostructures.

The solution optionally includes a copper (I) salt or a copper (II) salt, for example, copper sulfate, copper acetate, or copper nitrate. The solution can include a copper complex comprising a chelating agent (a polydentate ligand that forms two or more coordinate bonds to the metal in the complex), for example, copper (II) tartrate or copper ethylenediaminetetraacetate (EDTA). The copper complex can be preformed prior to its addition to the solution, or it can be formed in the solution, for example, by mixing a copper salt and a chelating agent (e.g., Rochelle salt and a copper (II) salt to form copper (II) tartrate). Employing a copper complex, particularly a complex comprising an organic or other nonpolar ligand that has stronger van der Waals interactions with the surface of the substrate than do copper ions, typically results in greater adsorption on carbon-based substrates than is seen with uncomplexed copper ions.

In one class of embodiments the solution is an aqueous solution, typically, an alkaline solution. Optionally, the solution has a pH of 12 to 13. In another class of embodiments, the solution includes an organic solvent (e.g., hexane) instead of water.

As noted above, the copper ion or complex does not undergo any chemical reaction when it is adsorbed to form the nanoparticles. Thus the solution does not include a reducing agent, in contrast to the plating solution employed in the electroless deposition techniques described above.

Suitable substrates include a planar substrate, nonporous substrate, silicon wafer, or foil (e.g., a metal foil, e.g., stainless steel foil), but more preferably include porous substrates having high surface areas such as those described above, e.g., a mesh, fabric, e.g., a woven fabric (e.g., a carbon fabric), fibrous mat, population of particles, sheets, fibers (including, e.g., nanofibers), and/or the like. Thus, exemplary substrates include a plurality of silica particles (e.g., a silica powder), a plurality of carbon sheets, carbon powder or a plurality of carbon particles, natural and/or artificial (synthetic) graphite, natural and/or artificial (synthetic) graphite particles, graphene, graphene powder or a plurality of graphene particles, carbon fibers, carbon nanostructures, carbon nanotubes, and carbon black. The substrate is optionally a carbon-based substrate, for example, a population of graphite particles.

In embodiments in which the substrate comprises a population of particles (e.g., graphite particles), the particles can be of essentially any desired shape, for example, spherical or substantially spherical, elongated, oval/oblong, plate-like (e.g., plates, flakes, or sheets), and/or the like. Similarly, the substrate particles can be of essentially any size. Optionally, the substrate particles have an average diameter between about 0.5 µm and about 50 µm, e.g., between about 0.5 µm and about 2 µm, between about 2 µm and about 10 µm, between about 2 µm and about 5 µm, between about 5 µm and about 50 µm, between about 10 µm and about 30 µm, between about 10 µm and about 20 µm, between about 15 µm and about 25 µm, between about 15 µm and about 20 µm, or about 20 µm. In one exemplary class of embodiments, the substrate is a population of graphite particles, and the graphite particle size is about 10-20 µm. In another exemplary class of embodiments, the substrate is a population of graphite particles, the graphite particle size is a few µm (e.g., about 2 µm or less), and the graphite particles are optionally spherical.

In embodiments in which the substrate comprises a population of particles, the methods can include filtering the solution to recover the substrate particles from the solution after deposition is complete (e.g., after the nanoparticles have reached a desired size, the desired amount of copper has been adsorbed on the substrate, or the solution is substantially completely depleted of copper ions and/or complex).

The solution is optionally heated to a temperature at which the ligand in the copper complex is stable, e.g., to 60-70° C., to increase adsorption. After formation of the nanoparticles and removal of the substrate from the solution, the substrate can be further heated, e.g., to a temperature above which the ligand in the complex is stable, to decompose the copper compound constituting the nanoparticles and yield copper oxide or (if heating is performed in a reducing atmosphere) elemental copper nanoparticles. Such heating can be a separate step, but more typically occurs in the course of nanostructure synthesis from the nanoparticles.

The concentration of copper ions and/or complex in the solution can be varied as desired. However, limiting the amount of copper present in the solution can be advantageous, since disposal of used solution is simplified if copper is substantially completely depleted from the solution by formation of the nanoparticles, as noted for the electroless deposition techniques above. Thus, in one class of embodiments, the solution comprises at most 10 millimolar copper ions or atoms. Optionally, the solution comprises at most 8 millimolar copper, at most 6 millimolar copper, at most 4 millimolar copper, or at most 2 millimolar copper. It will be evident that the solution initially comprises substantially more than 5 ppm copper; for example, the initial concentration of copper ions or atoms can be at least 2 millimolar, e.g., at least 4 millimolar, at least 6 millimolar, or at least 8 millimolar.

The resulting nanoparticles optionally have an average diameter between about 1 nm and about 100 nm, e.g., between about 5 nm and about 100 nm, between about 10 nm and about 100 nm, between about 20 nm and about 50 nm, or between about 20 nm and about 40 nm. Optionally, the nanoparticles have an average diameter of about 20 nm. The nanoparticles can be of essentially any shape, but are typically irregularly shaped.

Essentially all of the features noted for the embodiments above apply to these embodiments as well, as relevant: for example, with respect to nanostructure growth technique (e.g., VLS or VSS), type, composition, and size of the resulting nanostructures, ratio of nanostructures to substrate (e.g., silicon to graphite) by weight, incorporation into a battery slurry, battery anode, or battery, and/or the like.

Figure 5A:
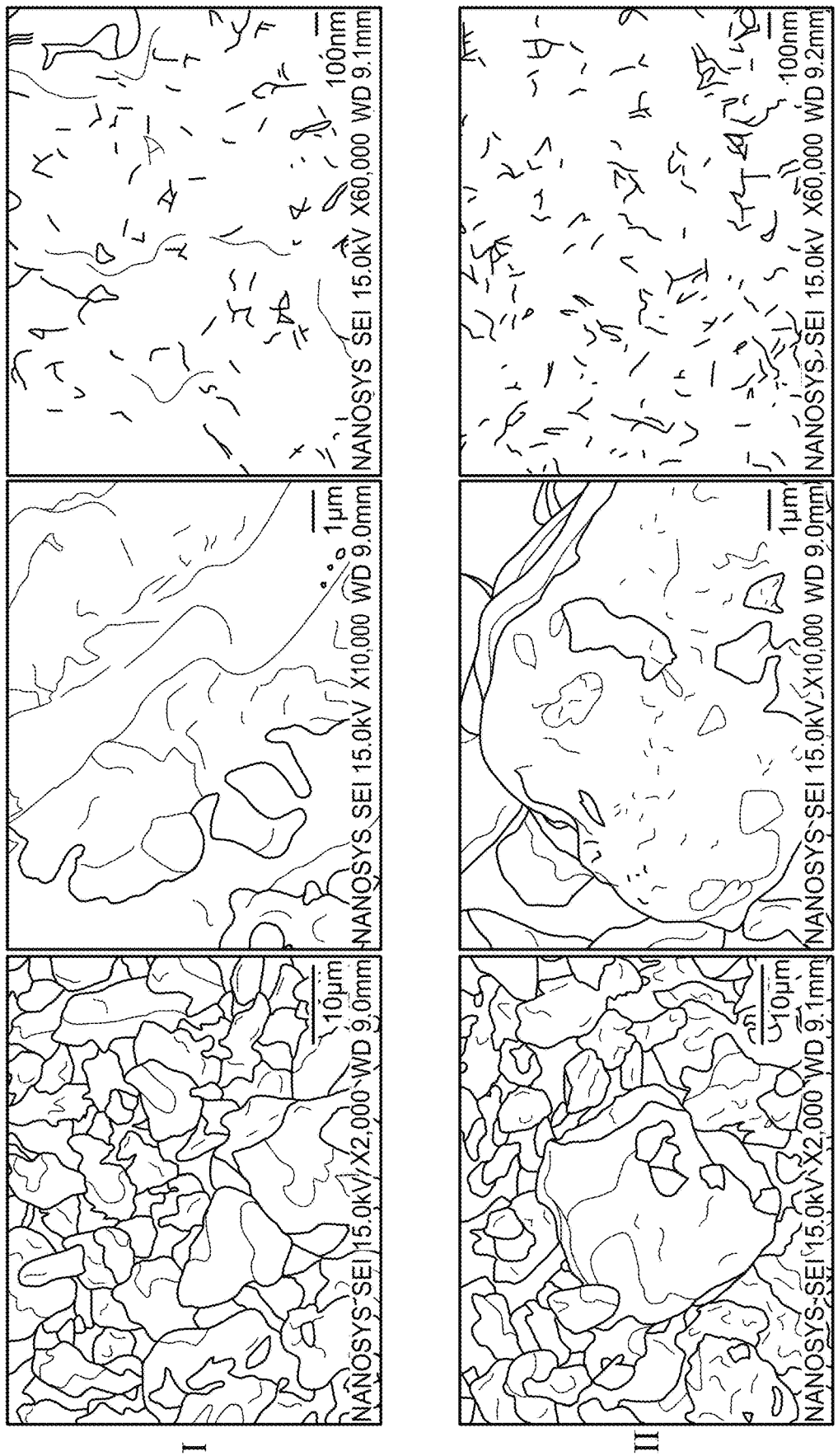
FIG. 5 Panel A shows scanning electron micrographs of nanoparticles deposited on a particulate graphite substrate by electroless deposition (row I) and by adsorption (row II), at increasing magnification from left to right. Panel B shows scanning electron micrographs of silicon nanowires grown from the nanoparticles produced by electroless deposition (row I) and adsorption (row II), at increasing magnification from left to right.
Figure 5B:

FIG. 5 Panel A shows copper nanoparticles deposited on graphite particles by electroless deposition (row I) and adsorption (row II). FIG. 5 Panel B shows silicon nanowires grown from the nanoparticles: nanowire morphology and coverage on the graphite is similar for the different deposition methods.

Nanostructure Growth Using Core-Shell Catalyst Materials

Figure 4A:
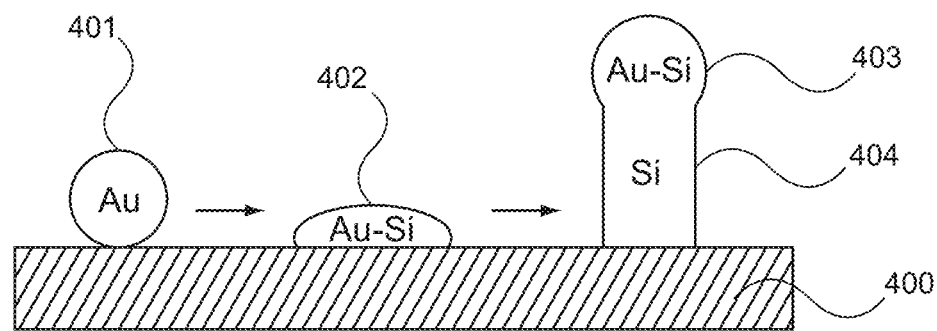
FIG. 4 Panel A schematically illustrates VLS growth of a silicon nanowire from a gold catalyst particle. Panel B schematically illustrates VLS growth of a silicon nanowire from a non-gold core/gold shell catalyst particle. Panel C presents a graph showing the percentage of the nanoparticle volume occupied by the non-Au material (i.e., the volume of the core as a percentage of the overall volume including both the core and the shell) for a 15 nm non-Au core coated with an Au shell of varying thickness.
Figure 4B:
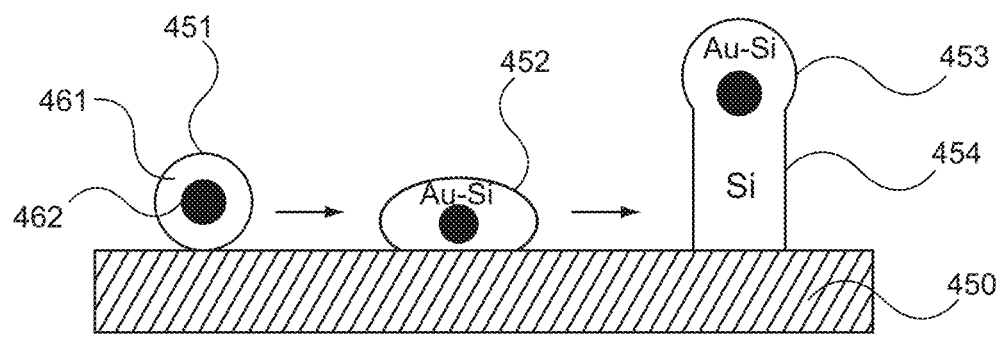
Figure 4C:
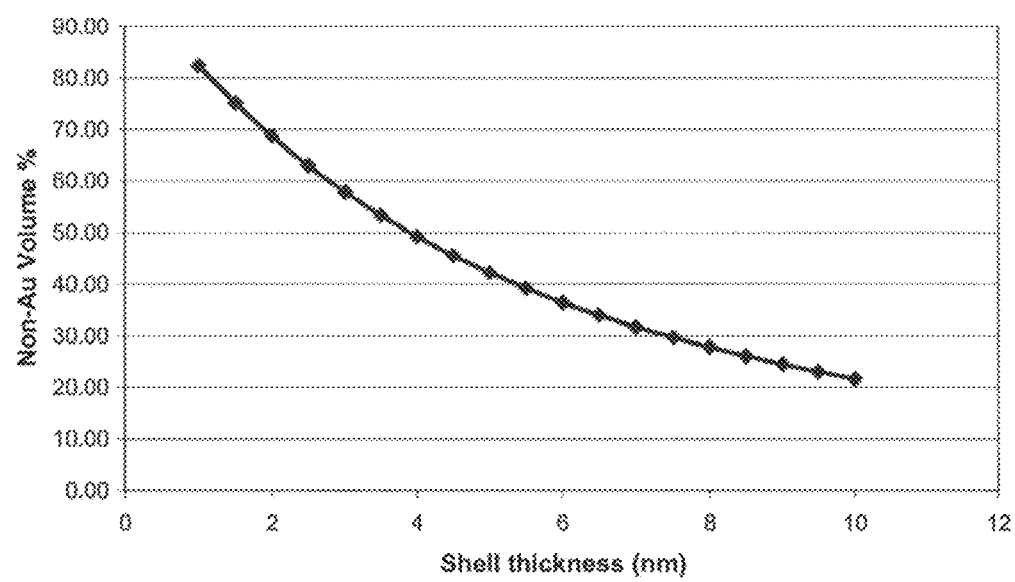

As noted above, gold (Au) nanoparticles have been extensively used for Si nanowire growth through the VLS mechanism. In this mechanism, as schematically illustrated in FIG. 4 Panel A, the Si from silanes in the vapor phase dissolves into mediating Au nanoparticles 401 deposited on substrate 400, to form Au—Si eutectic catalyst droplets 402. As the amount of Si in the Au—Si alloy droplet increases, the concentration of Si eventually goes beyond saturation. The Si then evolves from liquid droplet 403 to solid 404 and Si nanowires are formed. Solidified Au nanoparticles at the tips of the resulting nanowires are therefore typical characteristics of VLS-grown nanowires. The diameter of the Si nanowires is determined by the diameter of the Au nanoparticles.

With increasing demand for silicon nanowires, the cost of gold nanoparticles becomes more significant, potentially limiting the use of silicon nanowires for applications such as batteries and medical devices. The cost of the gold nanoparticles is mostly based on the materials price of gold. Methods described above focus on entirely replacing the gold catalyst with other materials. Another approach, however, is to decrease the amount of gold required.

Accordingly, one aspect of the present invention features methods of producing nanostructures (e.g., nanowires, e.g., silicon nanowires) in which nanoparticles that have a non-Au core encapsulated by an Au shell are used in place of solid Au nanoparticles as the catalyst particles. As schematically illustrated in FIG. 4 Panel B, catalyst particles 451 deposited on substrate 450 comprise non-Au core 462 and Au shell 461. During VLS growth when a non-Au core is present in the system, the liquid-solid interface differs from that for a solid gold catalyst. For ease of explanation, it is assumed that the non-Au core does not react with Au and Si and thus the eutectic nature of Au—Si does not change. Thus, during the growth process, Si from silanes in the vapor phase dissolves into the Au from the shell to form Au—Si eutectic catalyst droplets 452 still containing the non-Au core 462. As the amount of Si in the Au—Si alloy droplet increases, the concentration of Si eventually goes beyond saturation. The Si then evolves from liquid droplet 453 to solid 454 and Si nanowires are formed. Both gold and the non-gold core material are present at the tip of the resulting nanowire. For core materials where reaction between the core material, Au, and Si does occur, phase diagrams of the new ternary gold alloys can be explored.

The Au atoms forming the shell react with Si atoms to form the eutectic alloy. Without limitation to any particular mechanism, the presence of non-Au alien species at the interface of the eutectic droplet and Si allows Si nanowires with comparable diameter to be grown from the core shell catalyst particles as from single solid Au particles, while requiring less gold per nanowire. Thus, some percentage of Au can be replaced by the non-Au component, reducing the cost of nanowire synthesis. (Typically, the non-Au core material is much less expensive than is Au.)

As one specific example of how much gold can be saved by employing non-Au core/Au shell nanoparticles as catalysts for nanostructure synthesis, FIG. 4 Panel C represents the percentage of the nanoparticle volume occupied by the non-Au material (i.e., the volume of the core as a percentage of the overall volume including both the core and the shell) for a 15 nm non-Au core coated with an Au shell of varying thickness. As can be seen from the graph, up to 82.4% of Au can be saved if 15 nm non-Au core particles covered with a 1 nm Au shell are used for Si nanowire growth. This percentage savings decreases as thicker Au shells are used.

As noted, the core of the nanoparticles comprises a material other than gold. Exemplary materials for the core include, but are not limited to: metal oxides, for example, $Fe_2O_3$, $MFe_2O_4$ (where M is, e.g., Fe, Mn, Mg, Co, or Ni) particularly spinel type, $TiO_2$, $Al_2O_3$, and ZnO; metals, for example, Fe, Ni, Co, Pd, and Ag; and non-metal oxides, for example, $SiO_2$ and other silicates such as polyhedral oligomeric silsesquioxanes. The material constituting the core can, but need not, form an alloy with gold. In embodiments in which the material constituting the core forms an alloy with gold, the alloy can but need not exhibit a eutectic point. Silver, for example, forms an alloy with gold but there is no eutectic phase. In the example described above for silicon nanowire growth, Au is needed at the surface to form an Au—Si alloy in the VLS growth mechanism. However, the core material can be designed to form an alloy with Au at one condition and at another condition not to form the alloy. In embodiments in which the formed alloy can also work as a catalyst for growth of other nanostructures such as nanotubes, nanobelts, and the like, the processing conditions can be controlled to form chimeric nanostructures between, e.g., silicon nanowires and other nanostructures.

The core is optionally between about 5 nm and about 500 nm in diameter, e.g., between about 10 nm and about 500 nm, between about 5 nm and about 100 nm, between about 10 nm and about 100 nm, between about 5 nm and about 40 nm, between about 5 nm and about 20 nm, or between about 5 nm and about 10 nm in diameter. The thickness of the gold shell is optionally between about 1 nm and about 50 nm, e.g., between about 1 nm and about 40 nm, between about 1 nm and about 20 nm, between about 1 nm and about 10 nm, or between about 1 nm and about 5 nm.

In one class of embodiments, nanowires are grown from the non Au core-Au shell catalyst particles. Optionally, the nanowires are hollow. Suitable materials for the nanostructures (e.g., nanowires) include, e.g., silicon and/or germanium, as well as the inorganic conductive or semiconductive materials noted hereinabove.

Essentially all of the features noted for the embodiments above apply to these embodiments as well, as relevant: for example, with respect to type, composition, and size of the resulting nanostructures, type and composition of substrate (nonporous, porous, particles, graphite particles, sheets, wafers, etc.), ratio of nanostructures to substrate (e.g., silicon to graphite) by weight, incorporation into a battery slurry, battery anode, or battery, and/or the like.

In a related aspect, nanoparticles that have an Au core encapsulated by a non-Au shell are used as catalyst particles for nanostructure synthesis. Exemplary materials for the shell include, but are not limited to: metal oxides, for example, $Fe_2O_3$, $MFe_2O_4$ (where M is, e.g., Fe, Mn, Mg, Co, or Ni) particularly spinel type, $TiO_2$, $Al_2O_3$, and ZnO; metals, for example, Fe, Ni, Co, Pd, and Ag; and non-metal oxides, for example, $SiO_2$ and other silicates such as polyhedral oligomeric silsesquioxanes. The material constituting the shell can, but need not, form an alloy with gold. In embodiments in which the material constituting the shell forms an alloy with gold, the alloy can but need not exhibit a eutectic point.

Use of Au core-non Au shell catalyst particles, like use of non Au core-Au shell catalyst particles described above, can be advantageous in reducing the amount of gold required for nanostructure synthesis. It can also offer additional advantages, for example, by facilitating synthesis of core-shell nanostructures. For example, nanostructures having an Au core and a Ni shell can be employed as catalyst particles. Core and shell sizes of the catalyst particles are selected to produce an appropriate composition for the alloy (e.g., 20% Au and 80% Ni), and nanostructure synthesis is performed under appropriate conditions with different precursors (e.g., 20% silane and 80% ethylene) to produce nanostructures (e.g., nanowires) having a silicon core and a carbon shell.

Essentially all of the features noted for the embodiments above apply to these embodiments as well, as relevant: for example, with respect to size of the core, thickness of the shell, type, composition, and size of the resulting nanostructures, type and composition of substrate (nonporous, porous, particles, graphite particles, sheets, wafers, etc.), ratio of nanostructures to substrate (e.g., silicon to graphite) by weight, incorporation into a battery slurry, battery anode, or battery, and/or the like.

EXAMPLES

It is understood that the examples and embodiments described herein are for illustrative purposes only and that various modifications or changes in light thereof will be suggested to persons skilled in the art and are to be included within the spirit and purview of this application and scope of the appended claims. Accordingly, the following examples are offered to illustrate, but not to limit, the claimed invention.

Example 1: Synthesis of Colloidal $Cu_2O$, Deposition of $Cu_2O$ Nanoparticles on Graphite Particles, and Growth of Silicon Nanowires from the $Cu_2O$ Catalyst $Cu_2O$ colloidal nanoparticles are prepared as follows. Solution A is prepared by mixing 18 ml deionized water, 2 ml 0.1M copper sulfate, and 30 ml 0.01M CTAB (cetrimonium bromide). Solution B is prepared by mixing 48 ml deionized water, 1 ml 0.5M sodium ascorbate, and 1 ml 5M sodium hydroxide. Solution B is added to solution A while stirring, and the mixture turns to golden yellow almost instantaneously. The $Cu_2O$ colloid synthesized is stable for at least a few hours and has an average diameter of about 45 nm based on light scattering measurements.

The $Cu_2O$ colloidal nanoparticles are then deposited on graphite substrate particles as follows. In another beaker, about 10 g synthetic graphite powder having an average diameter of about 10 μm is mixed with 100 ml deionized water and agitated for at least 5 minutes using a magnetic stirring bar at a speed of 400 rpm. The graphite slurry is then heated to about 65° C. under constant stirring. At about 65° C., all the $Cu_2O$ colloid synthesized above is slowly added to the graphite slurry, and the solution temperature is maintained at 60-65° C. for 30 minutes. Then the slurry is filtered under vacuum through a filtration apparatus having a pore size of 0.2 μm and rinsed with copious amount of deionized water. The graphite cake is removed from the filter and then dried in an oven at 120° C. for at least 12 hours. The effluent collected in the filtration apparatus is analyzed for copper concentration, which is about 10 ppm. $Cu_2O$ nanoparticles are adsorbed on the graphite particles and the amount of copper is estimated to be 0.1% by weight (based on the amount of copper remaining in the effluent). See, e.g., FIG. 2 Panel A, which shows nanoparticles deposited on graphite particles under conditions similar to those described in this example.

Silicon nanowires are then synthesized from the $Cu_2O$ catalyst particles on the graphite substrate as follows. 10 g graphite powder with the $Cu_2O$ catalyst is loaded in a quartz cup with its bottom comprising a thin sheet of carbon paper and a disc of quartz frit, both of which are permeable to gas but not to the graphite particles. The quartz cup is covered with a quartz lid which is connected to the gas inlet port of a hot-wall CVD reactor. The reactor is ramped to a temperature of 460° C., initially under vacuum and later in hydrogen flowing at 200 sccm or higher. Silicon nanowires are grown at 45 Torr having a partial pressure of 1-4 Torr in silane, which is diluted by hydrogen and/or helium.

The graphite particles, after 45 minutes of growth, gain about 5-10% weight. The top layer of the graphite bed is lighter in color than the bottom layer due to gas depletion effect, which may be mitigated by flowing the reactant gases in both upward and downward directions or employing a reaction system in which the graphite particles and the reactant gases are mixed more evenly throughout the growth process. Silicon nanowires grown on the graphite particles have an average diameter between 10 nm and 100 nm and are essentially crystalline due to the nature of the VSS growth mechanism. Some nanowires are straight but most are kinked (see, e.g., FIG. 2 Panel B, which shows nanowires grown under conditions similar to those described in this example). One end of the nanowire is attached to the graphite surface and the other end has a $Cu_3Si$ (copper silicide) tip.

Example 2: Electroless Deposition of Copper on Graphite Particles and Growth of Silicon Nanowires from the Copper Catalyst About 10 g synthetic graphite powder having an average diameter of about 10 μm is mixed with 100 ml deionized water in a glass beaker and agitated for at least 5 minutes using a magnetic stirring bar at a speed of 400 rpm. 1 ml stock solution having 0.2M copper sulfate and 5.3M formaldehyde is pipetted into the graphite slurry, and heated to about 65° C. under constant stirring. At 60° C. or higher. 1 ml stock solution having 0.4M Rochelle salt and 5M sodium hydroxide is added by pipet. After a 30 minute reaction at 60-65° C. the slurry is filtered under vacuum through a filtration apparatus having a pore size of 0.2 μm and rinsed with copious amount of deionized water. Optionally, the residual formaldehyde in the plating solution is treated with 0.6 g sodium sulfite either before or after the filtration step. The graphite cake is removed from the filter and then dried in an oven at 120° C. for at least 12 hours. The effluent collected in the filtration apparatus is analyzed for copper concentration, which is typically 1 ppm or below. The amount of copper catalyst in the graphite powder is estimated to be 0.12% by weight (based on the amount of copper remaining in the effluent). Copper nanoparticles vary in size between 10 nm to 100 nm and are distributed fairly evenly on the graphite particles. See, e.g., FIG. 3 Panel A, which shows nanoparticles produced under conditions similar to those described in this example.

Silicon nanowires are grown from the copper nanoparticles on the graphite particles under the same conditions as in Example 1, with similar results in weight gain and nanowire morphology. See, e.g., FIG. 3 Panel B, which shows nanowires grown under conditions similar to those described in this example.

Example 3: Adsorption of Copper Complexes on Graphite Particles and Growth of Silicon Nanowires from the Copper Catalyst About 10 g synthetic graphite powder having an average diameter of about 10 μm is mixed with 100 ml deionized water in a glass beaker and agitated for at least 5 minutes using a magnetic stirring bar at a speed of 400 rpm. 1 ml 0.2M copper sulfate solution is added by pipet to the graphite slurry and heated to about 65° C. under constant stirring. At 60° C. or higher, 1 ml stock solution having 0.4M Rochelle salt and 5M sodium hydroxide is added by pipet. After a 30 minute reaction at 60-65° C., the slurry is filtered under vacuum through a filtration apparatus having a pore size of 0.2 μm and rinsed with copious amount of deionized water. The graphite cake is removed from the filter and then dried in an oven at 120° C. for at least 12 hours. The effluent collected in the filtration apparatus is analyzed for copper concentration, which is typically 1-2 ppm or below. The amount of copper catalyst in the graphite powder is estimated to be 0.12% by weight (based on the amount of copper remaining in the effluent). Copper nanoparticles vary in size between 10 nm to 50 nm and are distributed fairly evenly on the graphite particles. See, e.g., FIG. 5 Panel A, row II, which shows nanoparticles produced under conditions similar to those described in this example.

Silicon nanowires are grown from the copper nanoparticles on the graphite particles under the same conditions as in Example 1, with similar results in weight gain and nanowire morphology. See, e.g., FIG. 5 Panel B, row II, which shows nanowires grown under conditions similar to those described in this example.

While the foregoing invention has been described in some detail for purposes of clarity and understanding, it will be clear to one skilled in the art from a reading of this disclosure that various changes in form and detail can be made without departing from the true scope of the invention. For example, all the techniques and apparatus described above can be used in various combinations. All publications, patents, patent applications, and/or other documents cited in this application are incorporated by reference in their entirety for all purposes to the same extent as if each individual publication, patent, patent application, and/or other document were individually indicated to be incorporated by reference for all purposes.

What is claimed is:
1. A method for producing nanostructures, the method comprising:
 providing a porous substrate having catalyst particles disposed thereon, which catalyst particles comprise copper, a copper compound, and/or a copper alloy; and growing the nanostructures from the catalyst particles in a reaction vessel;

wherein the substrate is a population of graphite particles having the catalyst particles disposed thereon, and the nanostructures are silicon nanowires grown by a vapour-solid-solid or a vapour-liquid-solid synthesis technique, and wherein the population of graphite particles form a packed bed in the reaction vessel in which the nanostructures are grown.

2. The method of claim 1, wherein after the nanostructure growth is complete, silicon accounts for between 1 and 50% of the total weight of the nanostructures and the graphite particles.

3. The method of claim 1, wherein after the nanostructure growth is complete, silicon accounts for between 2 and 25% of the total weight of the nanostructures and the graphite particles.

4. The method of claim 1, wherein after the nanostructure growth is complete, silicon accounts for between 6 and 20% of the total weight of the nanostructures and the graphite particles.

5. The method of claim 1, wherein the nanostructures are silicon nanowires grown by a vapour-solid-solid synthesis technique.

6. The method of claim 1, wherein the catalyst particles have an average diameter of between 5 nm and 100 nm.

7. The method of claim 1, wherein the nanowires have an average diameter of between 10 nm and 100 nm.

8. The method of claim 1, wherein the substrate particles have an average particle size of 0.5 μm to 50 μm.

9. The method of claim 1, wherein the substrate particles are mixed during growth of the nanostructures.

10. The method of claim 1, wherein the reaction vessel in which the nanostructures are grown is horizontal and made to rotate during growth of the nanostructures.

11. The method of claim 1, wherein the substrate particles are fluidized by ultrasonic or mechanical shaking during growth of the nanostructures.

12. The method of claim 1, further comprising, after growing the nanostructures, incorporating the substrate and the nanostructures into a battery slurry or a battery anode or a battery.

13. The method of claim 1, wherein the porous substrate having catalyst particles is fluidized.

14. The method of claim 1, wherein the porous substrate having catalyst particles is fluidized by ultrasonic or mechanical shaking.

15. The method of claim 1, wherein the growing comprises forming the packed bed in the reaction vessel.

16. The method of claim 15, wherein the growing comprises mixing the packed bed while flowing one or more reactant gases in the reaction vessel.

17. The method of claim 1, wherein the vapour-solid-solid or vapour-liquid-solid synthesis technique comprises flowing silane in the reaction vessel during the growing.

18. The method of claim 1, further comprising, after growing, applying a carbon coating or an oxide coating to the nanostructures.

19. The method of claim 1, wherein the substrate particles have an average particle size of 2 μm to 10 μm.

20. The method of claim 1, wherein the population of graphite particles is porous.

21. The method of claim 20, wherein the graphite particles comprise a capillary network through their structure.

* * * * *